United States Patent [19]

Misawa et al.

[11] Patent Number: 5,754,158

[45] Date of Patent: May 19, 1998

[54] LIQUID CRYSTAL DEVICE

[75] Inventors: Toshiyuki Misawa; Hiroyuki Oshima, both of Nagano-ken, Japan

[73] Assignee: Seiko Epson Corporation, Tokyo, Japan

[21] Appl. No.: 877,469

[22] Filed: Jun. 17, 1997

Related U.S. Application Data

[63] Continuation of Ser. No. 462,275, Jun. 5, 1995, abandoned, which is a continuation of Ser. No. 402,376, Mar. 13, 1995, Pat. No. 5,583,347, which is a continuation of Ser. No. 142,892, Oct. 25, 1993, abandoned, which is a continuation of Ser. No. 924,695, Jul. 31, 1992, abandoned, which is a division of Ser. No. 351,758, May 15, 1989, Pat. No. 5,250,931.

[30] Foreign Application Priority Data

May 17, 1988  [JP]  Japan ................................. 63-119919

[51] Int. Cl.$^6$ ........................................................ G09G 3/36
[52] U.S. Cl. ........................... 345/100; 345/904; 324/770
[58] Field of Search ........................ 345/87, 89, 100, 345/904; 324/770

[56] References Cited

U.S. PATENT DOCUMENTS

| | | | |
|---|---|---|---|
| 3,964,941 | 6/1976 | Wang | 437/56 |
| 3,967,253 | 6/1976 | Tsuruishi | 365/108 |
| 4,199,773 | 4/1980 | Goodman et al. | 257/351 |
| 4,271,422 | 6/1981 | Ipri | 257/351 |
| 4,346,378 | 8/1982 | Shanks | 345/134 |
| 4,399,605 | 8/1983 | Dash et al. | 437/34 |
| 4,429,305 | 1/1984 | Hosokawa et al. | 345/90 |
| 4,507,846 | 4/1985 | Ohno | 437/21 |
| 4,573,766 | 3/1986 | Bournay, Jr. et al. | 349/65 |
| 4,586,039 | 4/1986 | Nonomura et al. | 345/90 |
| 4,671,642 | 6/1987 | Ohkubo et al. | |
| 4,677,735 | 7/1987 | Malhi | 437/34 |
| 4,724,433 | 2/1988 | Inoue et al. | 345/208 |
| 4,740,782 | 4/1988 | Aoki et al. | 345/92 |
| 4,799,057 | 1/1989 | Takeda et al. | 345/103 |
| 4,818,981 | 4/1989 | Oki et al. | 345/92 |
| 4,823,126 | 4/1989 | Nagata et al. | 360/825.79 |
| 4,838,654 | 6/1989 | Hamaguchi et al. | 349/45 |

(List continued on next page.)

FOREIGN PATENT DOCUMENTS

| | | |
|---|---|---|
| 0 179 914A | 5/1986 | European Pat. Off. . |
| 239 958 | 10/1987 | European Pat. Off. . |
| 259 875 | 3/1988 | European Pat. Off. . |
| 2 594 580 | 8/1987 | France . |
| A-58-137892 | 8/1983 | Japan . |
| A-59-83069 | 5/1984 | Japan . |
| A-59-150478 | 8/1984 | Japan . |
| 60-154660 | 8/1985 | Japan ........................ 257/351 |

(List continued on next page.)

OTHER PUBLICATIONS

Tomihisa Sunata et al., "A 640×400 Pixel Active–Matrix LCD Using a–Si TFT's ", Proceedings of the Society for Information Display (SID), 27 (1986) No. 3, New York, N.Y.

Young et al., "Avalanche Induce Mosfets," IEE Transaction On Electronic Development, vol. 35, No. 4, Apr. 1988, pp. 426–431.

Malhi et al., "Novel SOICMOS," IEDM, pp. 107–110.

Colinge, Electroic Letts, 1986 vol. 22, No. 44, pp. 187–188.

W. Ehrenberg, "Electric Conduction in Semiconductors and Metals," 1958, pp. 25–27.

(List continued on next page.)

Primary Examiner—Richard Hjerpe
Assistant Examiner—Vui T. Tran
Attorney, Agent, or Firm—Oliff & Berridge, PLC

[57]  ABSTRACT

An active matrix panel including a matrix of driving electrodes couples through thin film transistor switches to a corresponding source line and gate line and at least one of a driver circuit including complementary thin film transistors for driving the source and/or gate lines of the picture elements on the substrate. The thin film transistors of the active matrix have the same cross-sectional structure as the P-type or the N-type thin film transistors forming the driver circuit and are formed during the same patterning process.

36 Claims, 15 Drawing Sheets

U.S. PATENT DOCUMENTS

| | | | |
|---|---|---|---|
| 4,857,907 | 8/1989 | Koden | 349/140 |
| 4,864,890 | 9/1989 | McKechnie et al. | 475/230 |
| 4,881,066 | 11/1989 | Kanno et al. | 345/92 |
| 4,883,986 | 11/1989 | Egawa et al. | 327/581 |
| 4,922,240 | 5/1990 | Duwaer | 345/100 |
| 4,931,787 | 6/1990 | Shannon | 345/93 |
| 4,936,656 | 6/1990 | Yamashita et al. | 349/8 |
| 4,940,934 | 7/1990 | Kawaguchi et al. | 324/770 |
| 5,013,939 | 5/1991 | Satoh | 307/10.1 |
| 5,073,723 | 12/1991 | DeCosta | 327/567 |
| 5,095,348 | 3/1992 | Houston | 257/57 |
| 5,250,931 | 10/1993 | Misawa et al. | 345/206 |
| 5,537,054 | 7/1996 | Suzuki et al. | 324/770 |

FOREIGN PATENT DOCUMENTS

| | | |
|---|---|---|
| A-60-154660 | 8/1985 | Japan . |
| A-61-116334 | 6/1986 | Japan . |
| A-61-207073 | 9/1986 | Japan . |
| 61-235818 | 3/1987 | Japan . |
| 63-52121 | 5/1988 | Japan . |
| 2 070 857 | 9/1981 | United Kingdom . |
| 2 117 970 | 10/1983 | United Kingdom . |
| 2 126 779 | 3/1984 | United Kingdom . |

OTHER PUBLICATIONS

G. C. Gracey, "Overhead Electric Power Lines," 1963, pp. 27, 30–31.

Mozumi et al, "4.25 inch and 1.51 inch . . . LCD Video Displays Addressed by Poly–Si TFT's," SID 1984, Digest 316–319.

Malmberg et al., "Active Matrix LCD with Integrated Scanner Electronics," SID 1986 Digest, pp. 281–284.

Neudeck et al., "A CMOS–Like Amorphous Silicon Ambipolar Thin Film Transistor Invert Circuit," SID 1987 Digest pp. 151–154.

SID Symposium Digest Jun. 1984 pp. 312–319.

International Electron Devices Meeting. Dec. 9, 1987, pp. 448–451.

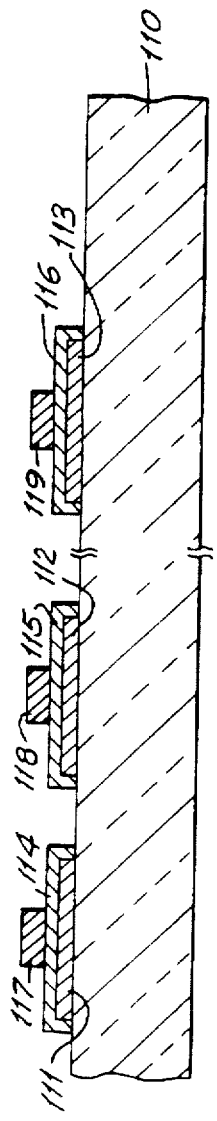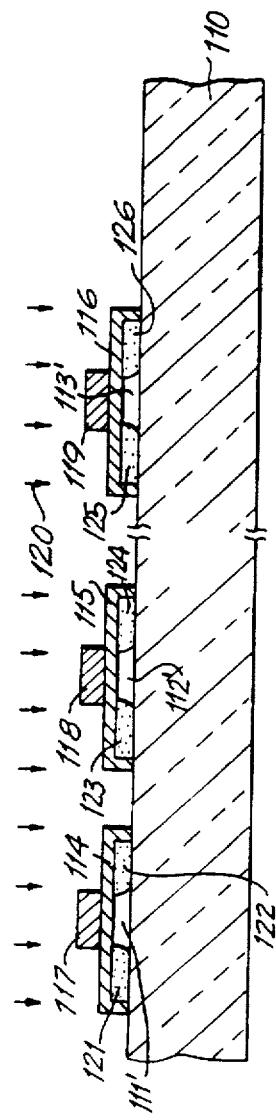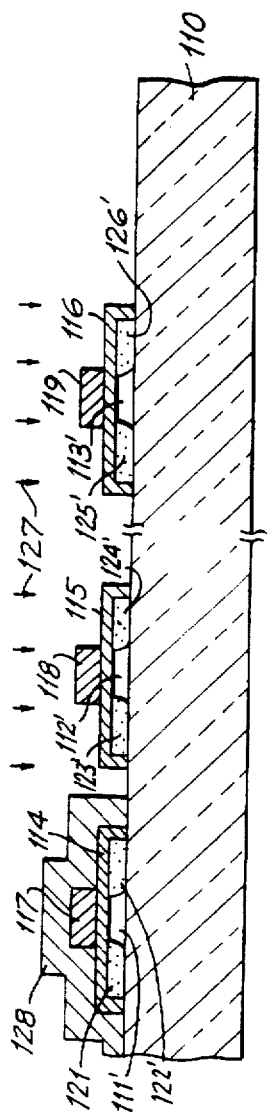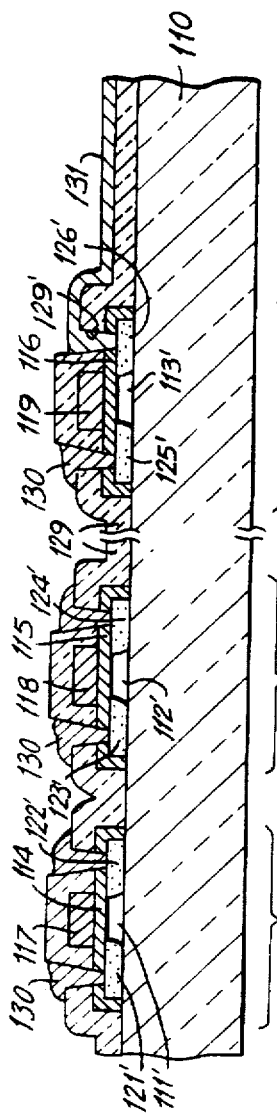
FIG. 4A
FIG. 4B
FIG. 4C
FIG. 4D

LIQUID CRYSTAL DEVICE

This is a continuation of application Ser. No. 08/462,275 filed Jun. 5, 1995 now abandoned, which in turn is a continuation of Ser. No. 08/402,376 filed Mar. 13, 1995, now U.S. Pat. No. 5,583,347 which is in turn a continuation of Ser. No. 08/142,892 filed Oct. 25, 1993, now abandoned, which is in turn a continuation application of Ser. No. 07/924,695 filed Jul. 31, 1992, now abandoned, which is a divisional of Ser. No. 07/351,758 filed May 15, 1989, now U.S. Pat. No. 5,250,931.

BACKGROUND OF THE INVENTION

The invention relates generally to an active matrix panel and more particularly to a high density active matrix panel formed with thin film transistors, for driving a liquid crystal display (LCD).

A conventional active matrix liquid crystal display panel including a matrix of liquid crystal picture elements formed with thin film transistors (TFT's) on a transparent substrate is described in Morozumi et al., "Black and White and Color Liquid Crystal Video Displays Addressed by Polysilicon TFTs", SID-83 Digest, pp. 156–57 and is shown in FIG. 19. A monocrystalline silicon MOS integrated gate line driver circuit 4' for driving a plurality of gate lines 4a' and a source line driver circuit 4 for driving a plurality of orthoganol source lines 4a are formed on a flexible substrate 3. An active matrix panel 1 includes a matrix of liquid crystal picture elements at the cross-over of respective gate lines 4a' and source lines 4a and a plurality of electrical connection pads 5. Driving circuits 4 and 4' are electrically coupled to panel 1 at pads 5. Both flexible substrate 3 and panel 1 are mounted on a substrate 6 and integrated driver circuits 4 and 4' are electrically coupled to other circuitry (not shown).

Such conventional active matrix panels can provide viewable displays, but they can have the following disadvantages.

1. Inadequate resolution.

Flexible substrate 3 and source lines 4a and gates lines 4a' of active matrix panel 1 are electrically coupled at pads 5. Accordingly, the picture elements cannot be sufficiently densely spaced because of the space occupied by pads 5. This interferes with mass production of active matrix panels having a picture element pitch of 100 μm or less and prevents high resolution.

2. Inadequate display device miniturization.

Driver integrated circuits 4 and 4' are located outside of panel 1 on substrate 6. Accordingly, active matrix panel 1 occupies only about ¼ or ⅕ of the surface area of substrate 6. Consequently, display devices including conventionally formed active matrix panels are undesirably larger than the picture element matrix portion of the entire panel. This makes it inconvenient to include conventional active matrix panels when miniaturization is needed, such as for a micro-monitor which can be used as an electric view finder for a video camera.

3. High manufacturing costs.

Manufacturing a conventional display including an active matrix panel requires many connections as follows. Active matrix panel 1 is connected to flexible substrate 3; driver integrated circuit 4 is connected to flexible substrate 3; and flexible substrate 3 is mounted on mounting substrate 6. These multiple connection steps increase manufacturing costs.

4. Low reliability.

Because conventional active matrix panels require so many connections, when stress is applied to the panel, these connections can come apart. This affects the reliability of the entire display and increases costs because extra measures must be undertaken to compensate for the possibility of disconnections.

Accordingly, it is desireable to develop an improved active matrix panel which does not have the shortcomings of conventional active matrix panels.

SUMMARY OF THE INVENTION

Generally speaking, in accordance with the invention, an active matrix device includes a substrate with a matrix of thin film transistor switching elements formed thereon. A gate line driver circuit and/or a source line driver circuit includes thin film transistors in a complementary metal oxide semiconductor (CMOS) configuration formed on the substrate having the same cross-sectional structure as the switching elements. The driver circuit thin film transistors are either of the P type of N type. The thin film transistors in a CMOS configuration are also referred to herein as complementary thin film transistors.

In one embodiment, the gate line driver circuit and/or the source line driver circuit on the panel substrate includes a static shift register formed of complementary thin film transistors. In another embodiment, the gate line driver circuit and/or the source line driver circuit include P-type and N-type thin film transistor in which the P-type thin film transistor includes acceptor impurities in the source region and drain region and the N-type thin film transistor includes donor impurities having a higher concentration than the acceptor impurities in the source and drain regions. Alternatively, the P-type thin film transistor includes donor impurities and acceptor impurities with a higher concentration of acceptor impurities than the donor impurities in the source region and drain region. The gate length of the P-type and N-type thin film transistors forming the gate line and source line driver circuits is shorter than the gate length of the thin film transistors of the active element matrix.

Accordingly, it is an object of the invention to provide an improved active matrix panel.

Another object of the invention is to provide an active matrix panel that is low in price and high in resolution and reliability.

A further object of the invention is to provide an active matrix panel which has low active element pitch.

Still another object of the invention is to provide an improved active matrix liquid crystal display panel having a high density of picture elements.

Still a further object of the invention is to provide an improved miniaturized active matrix panel.

Yet another object of the invention is to provide an improved active matrix panel that can be used as an electric view finder for a video camera, a monitor for a portable VCR and the like.

Still other objects and advantages of the invention will in part be obvious and will in part be apparent from the specification and drawings.

The invention accordingly comprises the several steps and the relation of one or more of such steps with respect to each of the others, and the article possessing the features, properties and the relation of elements, which are exemplified in the following detail disclosure, and the scope of the invention will be indicated in the claims.

3

BRIEF DESCRIPTION OF THE DRAWINGS

For a fuller understanding of the invention, reference is had to the following description taken in connection with the accompanying drawings, in which:

FIGS. 4A, 4B, 4C and 4D are cross-sectional views illustrating the steps for forming the thin film transistors of an active matrix panel in accordance with the invention;

4

Figure 18:
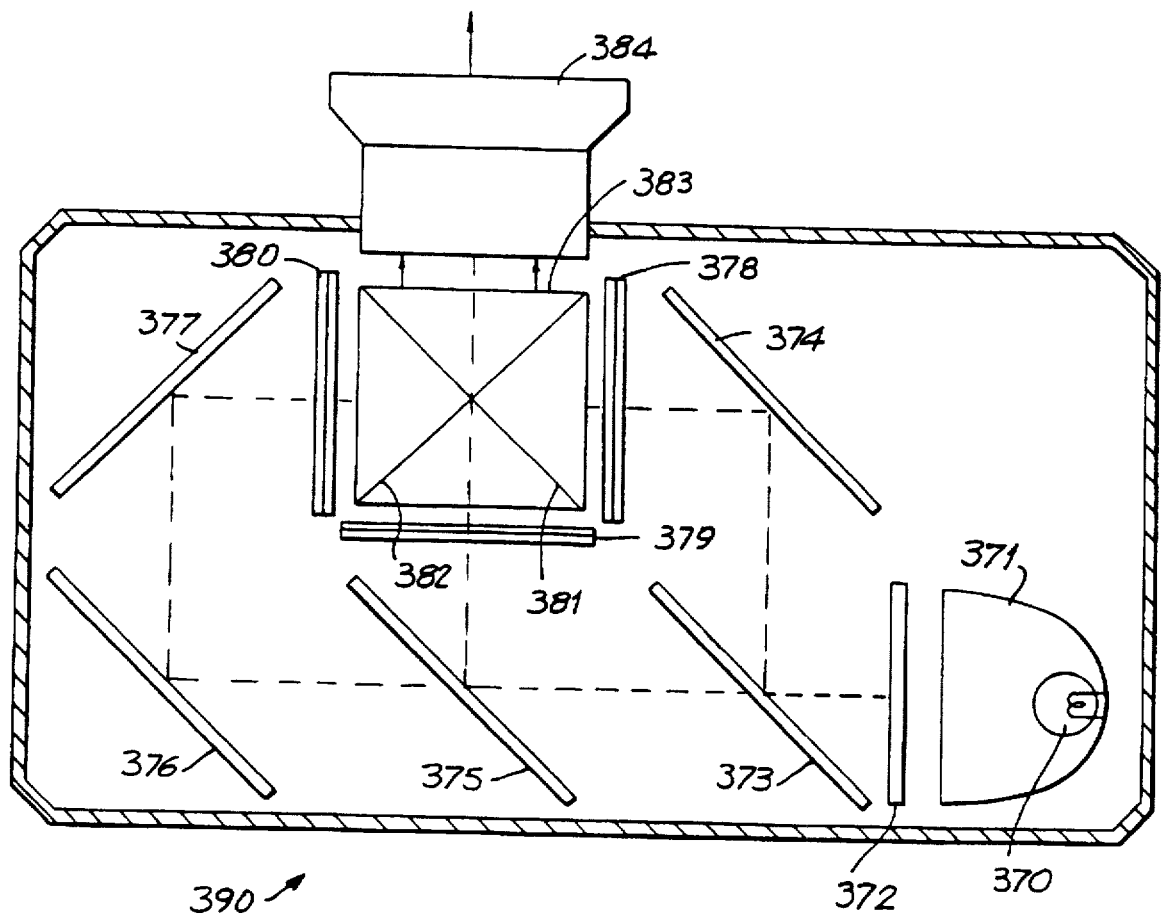
Figure 19:
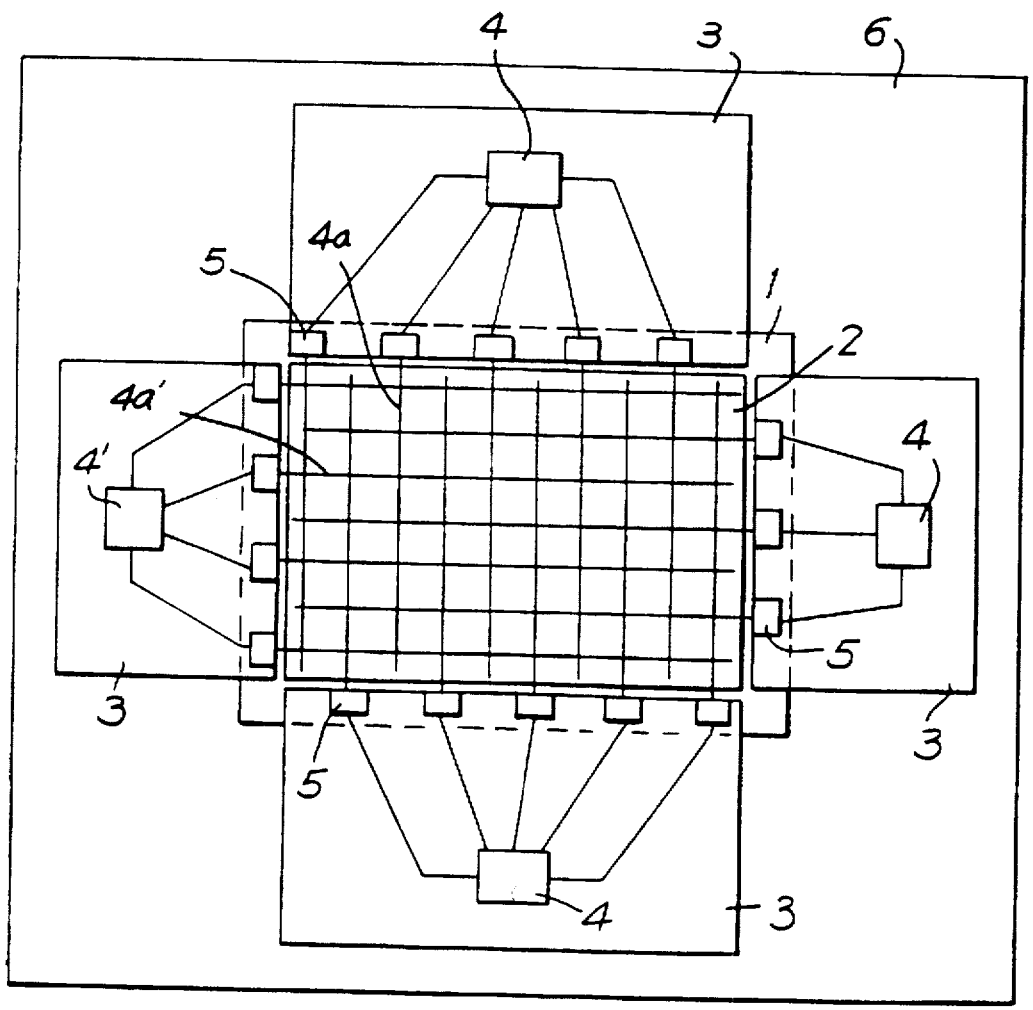

FIG. 18 is a top plan view of a projection type color device including an active matrix panel constructed in accordance with the invention; and FIG. 19 is a plan view of a conventional active matrix panel.

DESCRIPTION OF THE PREFERRED EMBODIMENTS

An active matrix panel formed in accordance with the invention is well suited for driving a liquid crystal display (LCD). The active matrix panel includes a plurality of gate lines and source lines and a thin film transistor at each intersection coupled to a liquid crystal driving electrode all formed on a first transparent panel substrate. A second transparent substrate with transparent common electrodes thereon is spaced apart from the panel substrate and a liquid crystal material is placed in the space between the substrates.

At least one of a gate line driver circuit and a source line driver circuit is formed on the panel substrate and coupled to the gate lines and source lines, respectively. The driver circuits include complementary thin film transistors (TFT's) of thin film silicon of P-type and N-type. The thin film transistors that form the switching elements of the picture element matrix are formed with the same cross-sectional structure as those for the driver circuits. The gate line driver circuit and the source line driver circuit can include a static shift register in the form of a complementary metal oxide semiconductor (MOS) structure.

The P-type thin film transistors of the driver circuits include acceptor impurities in the source and drain regions. The N-type thin film transistors include acceptor impurities and donor impurities, but have a higher concentration of donor impurities than acceptor impurities in the source and drain regions. In an alternative embodiment, the N-type thin film transistors include donor impurities in the source and drain regions and the P-type thin film transistors include donor and acceptor impurities, but have a higher concentration of acceptor impurities than donor impurities in the source and drain regions. In another embodiment, the length of the gate of the P-type and N-type type thin film transistors of the source line and gate line driver circuits are shorter than the gate regions of the thin film transistors coupled to the driving electrodes for the picture elements of the active matrix display.

Figure 1:
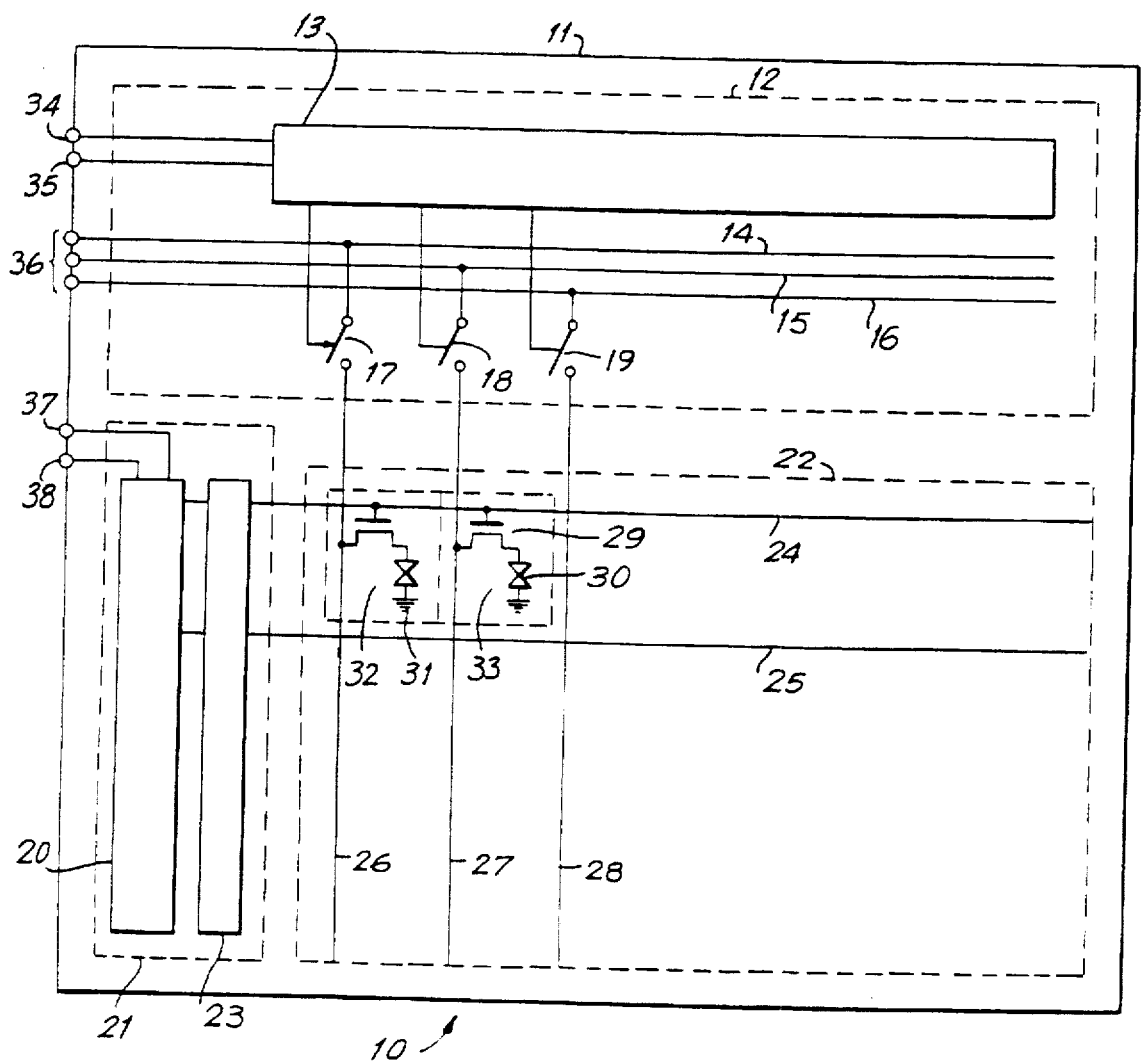
FIG. 1 is a block circuit diagram of an active matrix panel constructed in accordance with the invention.

FIG. 1 is a block circuit diagram illustrating the structure of an active matrix panel 10 constructed and arranged on a transparent substrate 11 in accordance with the invention. A source line driver circuit 12 including a shift register 13; a gate line driver circuit 21 including a shift register 20 and a buffer 23 if desired; and a picture element active matrix display 22 are formed on transparent substrate 11. Active matrix 22 is of the complementary metal oxide semiconductor (CMOS) structure formed of silicon thin film.

Source line driver circuit 12 includes a plurality of sample and hold circuits 17, 18 and 19 formed of thin film transistors (TFT's) and a plurality of video signal buses 14, 15 and 16. Gate line driver 21 includes a shift register 20 coupled to a buffer 23 for use when required.

Picture element matrix 22 includes a plurality of source lines 26, 27 and 28 electrically coupled to source line driver circuit 12 and a plurality of gate lines 24 and 25 electrically coupled to gate line driver circuit 21. A plurality of picture elements 32 and 33 are formed at intersections of each source line 26, 27, 28, etc. and gate line 24, 25, etc. Each picture element 32, 33, etc. includes a TFT 29 coupled to a portion of the liquid crystal panel identified as a liquid crystal cell 30. Liquid crystal cell 30 includes a picture element electrode (94 in FIG. 3B) formed on panel substrate 11 and an opposed common electrode 31 (97 in FIG. 3B) on the opposed substrate (98 in FIG. 3B) and a liquid crystal material (96 in FIG. 3B) therebetween. A counter or a decoder for selecting a source line and a gate line in order can be substituted for shift registers 13 and 20.

Active matrix panel 10 is operated by applying a clock signal CLX and a start signal DX to input terminals 34 and 35 of source line driver circuit 12. A plurality of video signals $V_1$, $V_2$, and $V_3$ are input into a plurality of corresponding input terminals 36 of source line driver circuit 12. A clock signal CLY and a start signal DY are input into a pair of input terminals 37 and 38 of gate line driver circuit 21, respectively.

Shift registers 13 and 20 can be either of the static type or dynamic type circuit formed of complementary P-type and N-type TFT's or of the dynamic or static type circuit of monoconductive type TFT's. However, in view of the performance characteristics of TFT's, the static type circuit formed of complementary TFT's is preferred.

An active matrix panel is generally formed of polycrystalline or amorphous silicon on an insulating substrate. Such TFT's have smaller ON current and larger OFF current compared to metal oxide semiconductor field effect transistors (MOSFET's) which is formed of monocrystalline silicon. This is due to the fact that the trap density existing in a silicon thin film is higher than the trap density in monocrystalline silicon. In view of this, the carrier mobility is reduced and recombination of carriers at reversibly biased P-N junctions occurs frequently.

In view of these TFT's performance characteristics and for the following reasons, it is preferred to include a static shift register of complementary TFT's in an active matrix panel formed in accordance with the invention.

1. When a TFT has a large OFF current, the operating voltage range, operating frequency range and operating temperature range of a dynamic circuit formed with that TFT is small.

2. A driver circuit is preferably in the form of a complementary MOS structure with low current compensation for best utilizing the low current consumption of an active matrix type liquid crystal panel.

3. The required ON current value can be smaller than in a monoconductive MOS dynamic shift register.

Figure 2A:
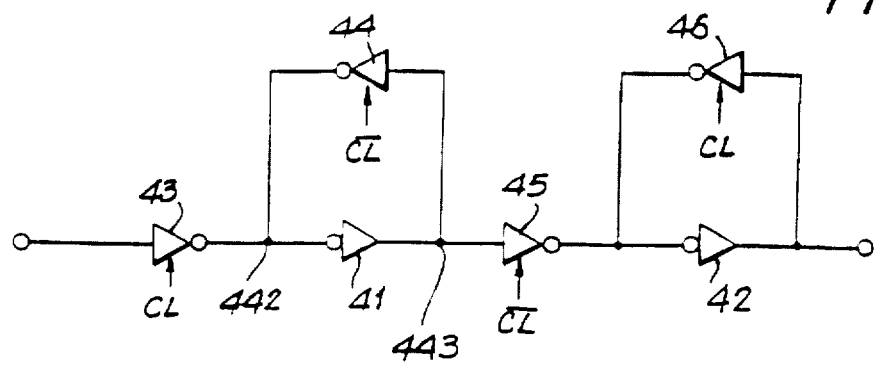
FIGS. 2A, 2B, 2C, 2D, 2E and 2F are circuit diagrams showing details of the driver circuits of FIG. 1.
Figure 2B:
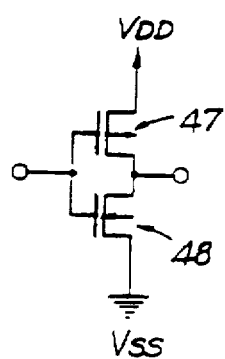
Figure 2C:
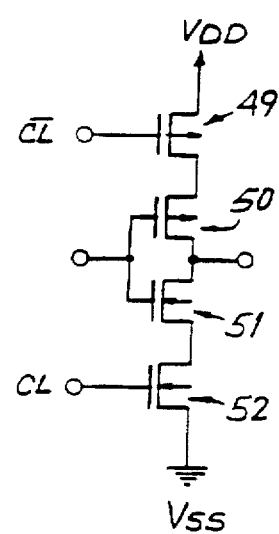
Figure 2D:
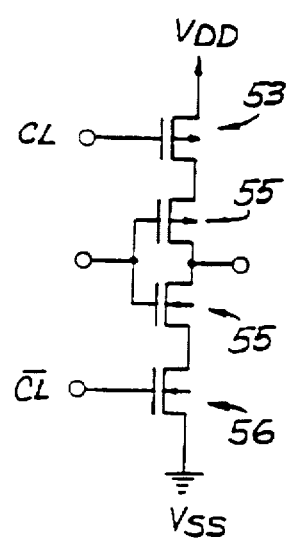

FIG. 2A is a circuit diagram of a portion of shift registers 13 and 20 of FIG. 1. The circuit includes a plurality of inverters 41 and 42, each formed of a P-type TFT 47 and an N-type TFT 48 shown in FIG. 2B. The circuit of FIG. 2A also includes a plurality of clock inverters 43 and 46, each formed of a pair of P-type TFT's 49 and 50 and a pair of N-type TFT's 51 and 52 as shown in FIG. 2C. As shown in FIG. 2C a clock signal CL is input into the gate of N-type TFT 52 and a reversed clock signal $\overline{CL}$ is input into the gate of P-type TFT 49. The circuit of FIG. 2A further includes a plurality of clock inverters 44 and 45, each formed of a pair of P-type TFT's 53 and 54 and a pair of N-type TFT's 55 and 56 as shown in FIG. 2D. Reversed signal $\overline{CL}$ is input into the gate of N-type TFT 56 and clock signal CL is input into the gate of P-type TFT 53.

Figure 2E:
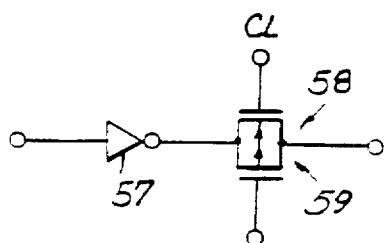
Figure 2F:
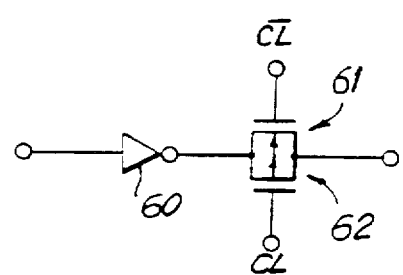

FIG. 2E shows an equivalent analog circuit that includes an inverter 57, an N-type TFT 58 and a P-type TFT 59 which may be substituted for clock inverters 43 and 46 in FIG. 2A. As shown in FIG. 2F, an equivalent analog circuit that includes an inverter 60, an N-type TFT 61 and a P-type TFT 62 which may be substituted for clock inverters 44 and 45.

Inverters 43 and 46 and inverters 44 and 45, as represented by the analog equivalent circuits of FIGS. 2E and 2F, respectively, are substantially the same except for the polarities of the clock signals applied to the gates of TFTs 58 and 61 and to the gates of TFTs 59 and 62 being reversed.

As has been described it is advantageous to construct a driver circuit of an active matrix panel with a complementary metal oxide semiconductor (CMOS) TFT structure. However, the mere inclusion of complementary TFT integrated circuits in prior art active matrix panel does not provide the advantages obtained in accordance with the invention. The prior art devices suffer from the following disadvantages.

1. It is complicated and expensive to form a conventional panel by integrating both a P-type TFT and an N-type TFT on the same substrate.

2. It is difficult to form a P-type TFT and an N-type TFT having balanced characteristics, although this is preferred for forming a complementary TFT integrated circuit.

3. Conventional P-type TFT's and N-type TFT's do not have sufficient driving ability to form a driver circuit.

These disadvantages have been solved by forming an active matrix panel in accordance with the invention, which has an improved structure, dimensions and materials.

Figure 3A:
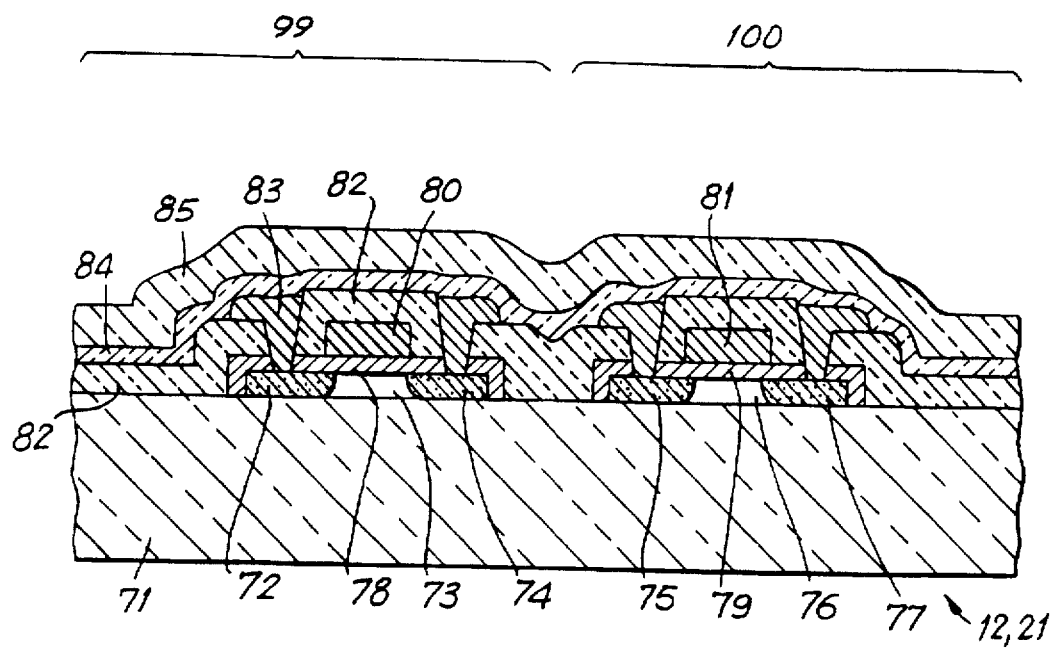
FIG. 3A is a cross-sectional view of a pair of complementary thin film transistors of the driver circuits of FIG. 1.

FIG. 3A is a cross-sectional view of a pair of complementary TFT's included in source line driver circuit 12 and gate line driver circuit 21 in FIG. 1. A P-type TFT 99 and an N-type TFT 100 are formed on an insulating substrate 71 of either glass or quartz crystal. TFT's 99 and 100 include a pair of thin silicon film channel regions 73 and 76 respectively and a plurality of thin silicon film regions 72, 74, 75 and 77 which are to be source and drain regions, all disposed on substrate 71. Silicon thin films 72 and 74 are doped with impurities to be P-type semiconductors. Silicon thin films 75 and 77 are doped with impurities to be N-type semiconductors. TFT's 99 and 100 each include respectively, a gate insulating film 78 and 79, a gate electrode 80 and 81, an insulating layer 82 and 84, conductive lines 83 and a passivation film 85 formed thereover.

Insulating layers 78, 79, 82 and 84 can be formed of silicon oxides such as $SiO_2$, silicon nitrides and the like. Gate electrodes 80 and 81 can be formed of polycrystalline silicon, metals, metal silicides and the like. Conductive line 83 is formed of a layer of conductive material such as a layer of a metal.

Figure 3B:
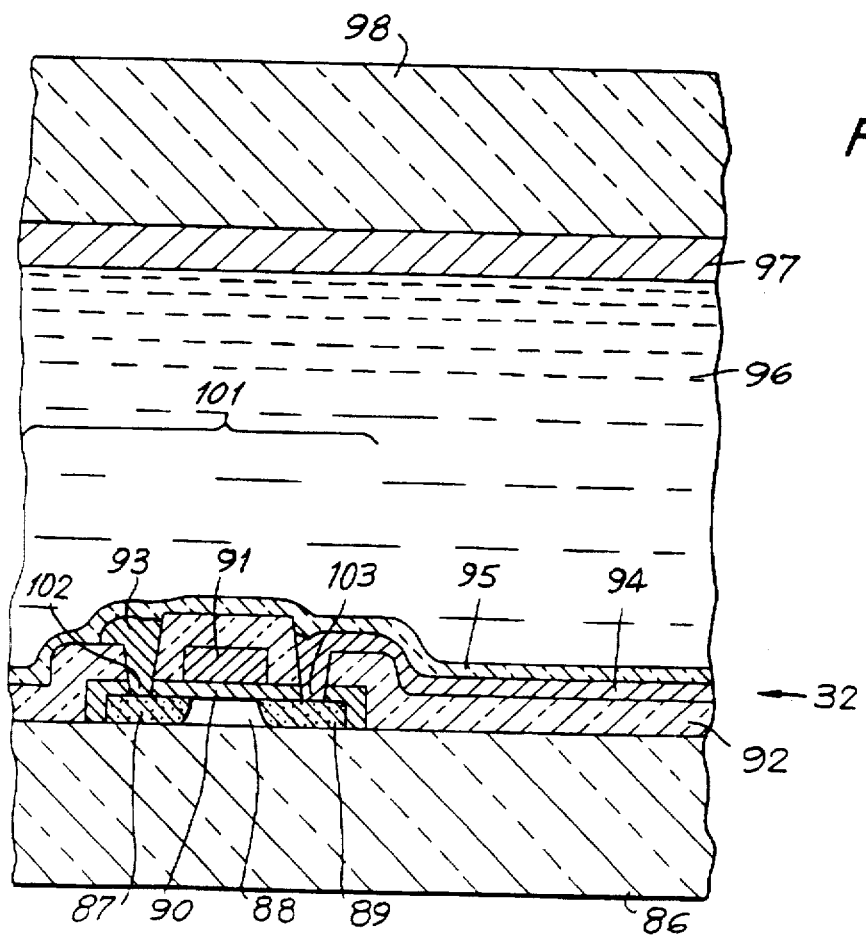
FIG. 3B is a cross-sectional view of a liquid crystal picture element of a display device including the active matrix panel of FIG. 1.

FIG. 3B shows a cross-sectional view of picture element 32, 33, etc. of active matrix panel 22. Reference numeral 86 identifies the same insulating substrate 71 in FIG. 3A. A picture element electrode 94 formed of a transparent conductive film such as ITO (indium tin oxide) is coupled to a picture element TFT 101. Regions 87, 88 and 89 of silicon thin film are formed of the same silicon thin film layers as regions 72, 73 and 74 of P-type TFT 99 and regions 75, 76 and 77 of N-type TFT 100 and form a channel region 88, a source region 87 and a drain region 89, respectively. Regions 87 and 89 are impurity-doped in P-type or in N-type and the compositions of impurities included are the same as those included in regions 72 and 74 or regions 75 and 77.

A gate insulating film 90 of the same layer as gate insulating films 78 and 79 is disposed on the silicon thin film. A gate electrode 91 of the same layer as gate electrodes 80 and 81 and an insulation layer 92 of the same layer as in insulation film 82 are disposed thereon. An electrode line 93 of the same layer as line 83 is coupled to source region 87 and an insulating film 95 of the same layer as insulating film 84 are formed across the entire active matrix display region.

An opposed common electrode 97 is formed on an opposed transparent substrate 98 with a liquid crystal material 96 in the space between substrates 86 and 98.

The source-drain region, channel region, gate insulation film and gate electrodes of TFT's 99 and 100 in the driver circuits are formed of the same thin film layers of picture element TFT 101. TFT's 99 and 100 of source line driver circuit 12 and gate line driver circuit 21 are electrically connected to the lines of active matrix display 22 through line layer 83. A source line in display 22 is formed of line layer 93 which is the same layer as line 83. Line layer 83 is formed of a metal having low sheet resistance, such as aluminum.

When line layer 93 is made of aluminum or alumi-silicide and transparent conductive driving electrode is ITO it is not necessary to dispose an insulating film therebetween. A pair of through holes 102 and 103 are opened simultaneously to expose source and drain regions 87 and 89 for connecting conductive line 93 and electrode 94. This simplifies the manufacturing process.

The aluminum and ITO layers are processed in individual etching solutions. The ITO is formed prior to the aluminum layer taking advantage of the fact that the ITO will not soak into the aluminum etching solution.

Insulating film 95 acts as a capacitor for preventing application of DC voltage to liquid crystal material 96. The capacitive value of the capacitor should be sufficiently large as compared to the capacitive value of the picture element to prevent DC voltage application to liquid crystal material 96. Thus, the thickness should be set at a predetermined value, for example, about 3,000 Å or less. The driver circuit portion of panel 10 is covered by passivation film 85 having a thickness greater than a predetermined value of about 1 μm to insure a wet-proof layer. A preferred method of forming passivation film 85 is to form a film over the entire active matrix substrate and then remove all except the driver portions. Accordingly, passivation film 85 is preferably formed of materials processed with an etching solution such as polyamide or the like in which insulation films 84 and 85 are not dissolved.

At least four photo processes are required to form a complementary metal oxide semiconductor (CMOS) integrated circuit formed with conventional monocrystalline silicon. These steps include forming a low concentration P well, forming a P-type stopper layer, forming a P-type source and drain metal oxide semiconductor field effect transistor (MOSFET) and forming a source and drain of N-type MOSFET. However, a complementary TFT integrated circuit can be formed with as few as one photo processing step compared with a method of manufacture for monoconductive type TFT integrated circuits.

FIGS. 4A, 4B, 4C and 4D illustrate steps of forming complementary TFT in an active matrix panel in accordance with the invention. A silicon thin film is disposed on a transparent substrate 110 in a desired pattern to provide silicon thin films 111, 112 and 113 for forming a channel region 111" of P-type TFT 132 and channel regions 112" and 113" of N-type TFT's 133 and 134. Gate insulating films 114, 115 and 116 are disposed on channel regions 111, 112 and 113 respectively by thermal oxidation and chemical vapor deposition and gate electrodes 117, 118 and 119 are formed thereon.

As shown in FIG. 4B, acceptor impurities 120, such as boron are implanted in silicon films 111, 112 and 113 on the surface of substrate 110 by ion implantation. Implanted acceptor impurities are activated by subsequent heat treatment to form P-type semiconductors. At this time acceptors are present in regions 123, 124, 125 and 126 which will become the source and drain regions of N-type TFT's 133 and 134 as well as regions 121 and 122 which become source and drain regions of P-type TFT 132.

FIG. 4C shows that P-type TFT 132 is covered with a masking material, such as photo resist 128. Donor impurities 127, such as phosphorous or arsenic are implanted into silicon thin films 112 and 113 at a higher concentration than acceptor impurities 120 in source and drain regions 123', 124', 125' and 126'. Because source and drain regions 121 and 122 are covered with photo resist 128, donor impurities 127 do not enter those regions.

Implanted donor impurities are subsequently activated by heat treatment. If regions 123', 124' 125' and 126' are implanted with a dosage of $1\times10^{15}$ cm$^{-2}$ acceptor ions and implanted with a dosage of $3\times10^{15}$ cm$^{-2}$ donor ions, these regions are equivalent to regions having a donor concentration corresponding to an implant dosage of $2\times10^{15}$ cm$^{-2}$. Accordingly, P-type source region 121 and drain region 122 and N-type source regions 123' and 125' and drain regions 124' and 126' are formed with only one masking step. After photo resist 128 is removed, an insulating layer 129 is disposed over the entire surface of substrate 110. A plurality of through holes 129' are formed in insulating film 129 and gate insulating films 114, 115 and 116 at each TFT to expose source and drain regions 121, 122 and 123'-126'.

A picture element electrode 131 formed of a transparent conductive film is disposed on insulating layer 129 and is electrically coupled to drain region 126' at through hole 129'. A plurality of lines 130, formed of metal or the like are disposed on insulating layer 129 and are electrically coupled with source and drain regions 121, 122 and 123'-125' through the respective through holes 129' in insulating layer 129. P-type TFT 132 and N-type TFT 133 form a complementary TFT driver circuit portion of an active matrix panel and N type TFT 134 is an active element for the liquid crystal picture elements.

The above sequence of donor and acceptor impurity implantation can be reversed. The initial implantation can be with donor impurities and the subsequent implantation with masking over the N-type TFT's can be with acceptor impurities. The P-type TFT would include both donor and acceptor impurities, but would have a higher concentration of acceptor impurities.

As shown in FIGS. 4A-4D, a complementary TFT integrated circuit can be formed with only one additional photo masking step to form an active matrix panel with a built in driver circuit. This has advantages over methods for forming monoconductive type TFT integrated circuits which require several additional masking steps. The lower number of masking steps has advantages, including lowering production costs. Because each TFT is electrically separated from the others by insulating layer 129, further steps for separating the TFT's are not required. In addition, problems associated with parasitic MOSFET do not occur because the integrated circuit is not formed of monocrystalline silicon so that a channel stopper is not required.

It is necessary that the P-type TFT and the N-type TFT of the complementary TFT integrated circuit have balanced characteristics. It is known to make TFT's with group II-VI semiconductors. However, complementary TFT's cannot be formed from these compounds for the following reasons.

1. It has been found not to be possible to control and form both P and N conductive types in the semiconductor compound.

2. It is difficult to control adequately the interface between the semiconductor compound and the insulating film for metal oxide semiconductor (MOS) construction.

Accordingly, source, drain and channel regions of TFT's are preferably formed of thin silicon films. Carrier mobilities of amorphous silicon thin films and polycrystalline silicon thin films are shown in Table 1. It is evident that polycrystalline thin films are preferable for forming complementary TFT integrated circuits, because the P-type and N-type carrier mobilities are similar so that the characteristics of the P-type and N-type semiconductors can be well balanced and the current supplying capacity of the resulting TFT can be increased.

TABLE 1

| Type of Silicon | Carrier Mobility (cm$^2$/V · sec) | |
|---|---|---|
| | N type | P type |
| amorphous silicon | 0.1–1 | $10^{-4}$–$10^{-3}$ |
| polycrystalline silicon | 5–50 | 5–50 |

It is advantageous to elevate the current supplying capacity of a TFT, especially the P-type and N-type TFT's which form the driver circuit. The trap density of a TFT formed from a thin silicon film which is not monocrystalline silicon is high. Consequently, ON current is small and OFF current is larger than with a monocrystalline silicon MOSFET.

Figure 5:
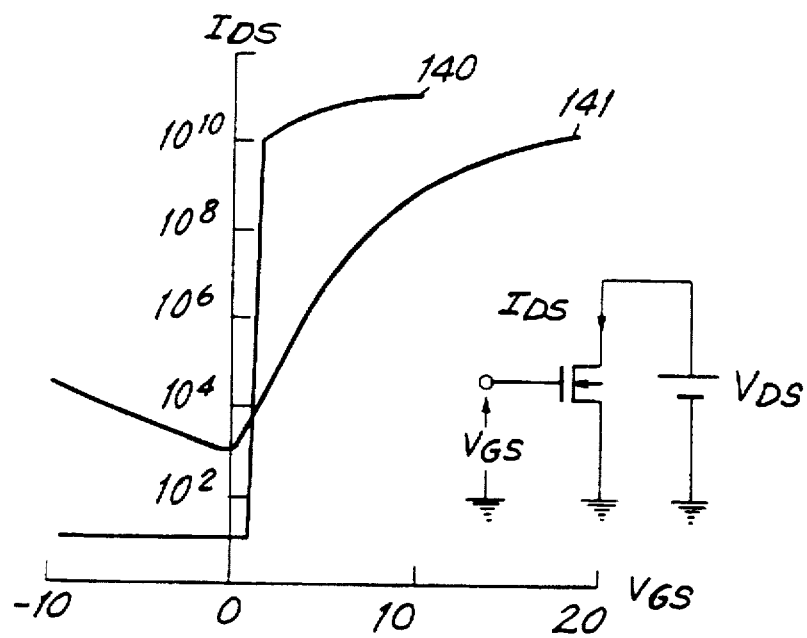
FIG. 5 is a graph comparing current-voltage characteristics of a TFT formed in accordance with the invention and a conventional monocrystalline silicon metal oxide semiconductor field effect transistor (MOSFET)

FIG. 5 is a graph comparing the current-voltage characteristics of a monocrystalline silicon MOSFET (curve 140) and a thin silicon film TFT (curve 141). The gate length, gate width and source/drain voltage $V_{DS}$ were the same. The abscissa corresponds to the voltage of the source ($V_{GS}$) as a reference and the ordinate corresponds to the relative value of current between the source and the drain ($I_{DS}$). FIG. 5 demonstrates that since the ON/OFF ratio of the TFT is small, TFT 29 of picture element matrix 22 and the TFT's forming driver circuits 12 and 21 should be formed with certain dimensions to optimize this ratio.

When an image from a National Television System Committee (NTSC) video signal is to be displayed, the picture element matrix TFT's should satisfy the following equations within the entire temperature range to which the active matrix panel will be exposed.

$$0.1 \times C_1 \cdot ROFF1 \geq \frac{1}{60} sec \quad (1)$$

$$5 \times C_1 \cdot RON1 \leq 10 \, \mu sec \quad (2)$$

$C_1$ represents the total capacitance of a picture element. RON1 and ROFF1 represent ON resistance and OFF resistance respectively of a TFT. Equation (1) should be satisfied by all of the picture elements of the matrix while in a holding operation (holding condition). If this condition is satisfied, 90% or more of the electric charge written into the capacity of the picture elements can be held over one field. If equation (2) is satisfied by all of the picture elements in the matrix while in the writing operation (writing condition), 99 % or more of the video signal can be written in picture elements.

The TFT's forming the driver circuit should satisfy the following equation over the temperature range to which the active matrix panel will be exposed.

$$k \times (C_2 \cdot RON2 + C_3 \cdot RON3) \leq \frac{1}{f} \quad (3)$$

$C_2$ and $C_3$ represent the capacitances at a junction 442 and a junction 443 shown in FIG. 2A. RON2 and RON3 correspond to the resistance of clock inverter 43 and output resistance of inverter 41, respectively. symbol f is the clock frequency of a shift register and k is a constant, which has been empirically determined to be from about 1.0 to 2.0. After performing a number of trials, it was determined that $RON_2$ and $RON_3$ should be about $\frac{1}{10}$ or less of $RON_1$ the ON resistance of the picture element TFT, to yield a shift register having a clocked frequency (f) of about 2 MHz.

The gate length of the TFT of a driver circuit should be formed as short as possible, within the limits of the permissible breakdown voltage, to achieve this low output resistance. The TFT which forms sample and hold circuits 17, 18 and 19 of FIG. 1 permits lower breakdown voltage than the TFT which forms shift register 13. Accordingly, the gate length of the hold circuit TFT's can be shorter than the gate length of the shift register TFT's.

Figure 6:
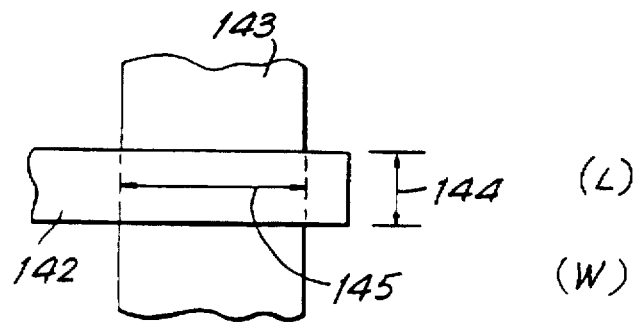
FIG. 6 is top plan view illustrating the dimensions of gate length and gate width of a thin film transistor gate formed in accordance with the invention.

FIG. 6 defines the manner of measuring the dimensions of a TFT. FIG. 6 shows a gate electrode 142 on a thin silicon film 143 that forms a channel region. Gate electrode 142 overlaps silicon film 143 and has a gate length (L) 144 and a gate width 145. Examples of gate lengths of TFT's of the active matrix panel are shown below in Table 2.

TABLE 2

| TFT Function | Gate length L (μm) | |
|---|---|---|
| | P-type TFT | N-type TFT |
| TFT for picture element matrix | | 20.0 |
| TFT for shift register | 4.0 | 5.5 |
| TFT for sample and hold circuit | | 4.5 |

In order to raise the current supplying capacity of a P-type TFT and an N-type TFT, a thickness $t_{si}$ of the thin silicon film between the source and drain is made to be smaller than the maximum calculated depletion layer thickness thich extends over the surface of the thin silicon film. The maximum calculated depletion layer thickness for P-type TFT's ($X_{PMAX}$) and for N-type TFT's ($X_{NMAX}$) formed of thin silicon films are represented by the following equations, respectively.

$$X_{PMAX} = (2\epsilon \times 2\phi fP)^{1/2} \times (q \times ND)^{-1/2} \quad (4)$$

$$X_{NMAX} = (2\epsilon \times 2\phi fN)^{1/2} \times (q \times NA)^{-1/2} \quad (5)$$

wherein: q represents a unit electric charge, $\epsilon$ represents the dielectric constant of a thin silicon film, $\phi fP$ represents a fermi energy of a P type TFT, $\phi fN$ represents the fermi energy of an N type TFT, ND represents equivalent donor density of the thin silicon film formed between the gate insulating film and the insulating substrate and NA represents equivalent acceptor density of the thin silicon film formed between the gate insulating film and the insulating substrate. The equivalent donor and acceptor densities are determined by the density of donor impurities in a region, the density of acceptor impurities in a region and the trap density which acts as a donor and acceptor. Thickness $t_{si}$ of P-type and N-type TFT's is preferably formed smaller than either of $X_{PMAX}$ or $X_{NMAX}$.

Figure 7:
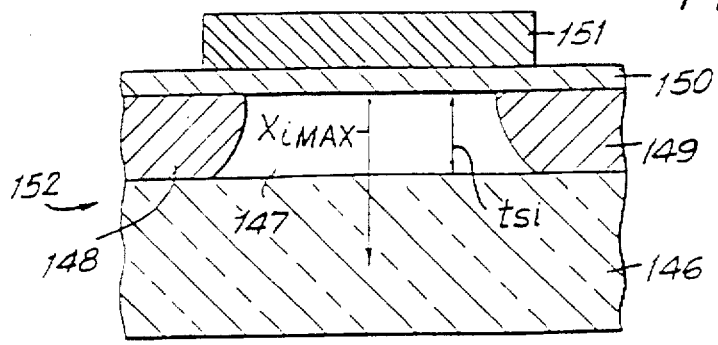
FIG. 7 is a cross-sectional view illustrating dimensions of depletion layer width and silicon film thickness in a TFT prepared in accordance with the invention.

FIG. 7 illustrates a TFT 152 formed on an insulating substrate 146 and includes a region 147, a source region 148, a drain region 149, a gate insulating film 150 and a gate electrode 151. The maximum calculated depletion layer thickness $X_{iMAX}$ (i.e., $X_{PMAX}$ or $X_{NMAX}$) extends from the boundary between gate insulation film 150 and region 147 into substrate 146.

To form an active matrix panel in accordance with this aspect of the invention:

1. The driver circuit is preferably a static shift register circuit formed of complementary TFT's.
2. Complementary TFT integrated circuits are formed;
3. P-type and N-type semiconductors of the complementary TFT are formed to have well-balanced characteristics; and
4. The TFT is formed to have acceptable driving capabilities.

However, further improvements can be made to form an active matrix panel having certain improved qualities.

Figure 8:
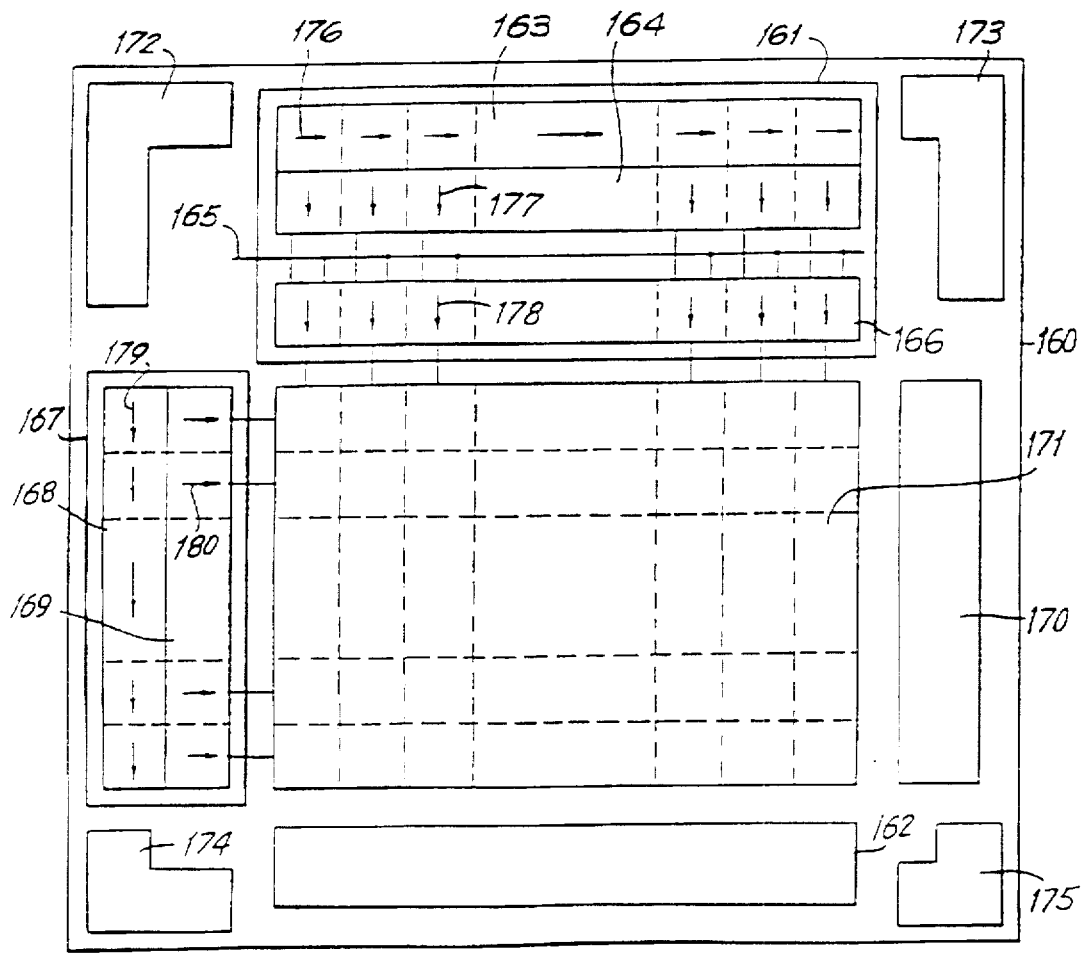
FIG. 8 is a top plan view of an active matrix panel arranged in accordance with the invention showing location of the elements of the device.

FIG. 8 is a plan view of an active matrix panel 160 showing the positioning of elements arranged in a preferred configuration. A source line driver circuit 161 (162) is formed at the periphery of active matrix panel 160 which is substantially a square in plan view. Source lines from source line driver circuit 161 run between the top and bottom of panel 160. A shift register 163, a buffer 164, a video signal bus 165 and a sample hold circuit 166 are arranged from the edge towards the center respectively within source line driver circuit 161. A gate line driver circuit 167 (170) is formed at the left or right edge of panel 160 and a shift register 168 and a buffer 169 are arranged from the edge towards the center within gate line driver circuit 167.

A picture element matrix 171 is formed at the center of active matrix panel 160 and is electrically coupled with source line driver circuit 161 and gate line driver circuit 167. A plurality of input terminals 172, 173, 174 and 175 are provided at each corner of panel 160. Signals are transmitted in directions indicated by a plurality of arrows 176-180. By arranging the functional portions of active matrix panel 160 as shown in FIG. 8, the limited space can be effectively utilized.

Figure 9:
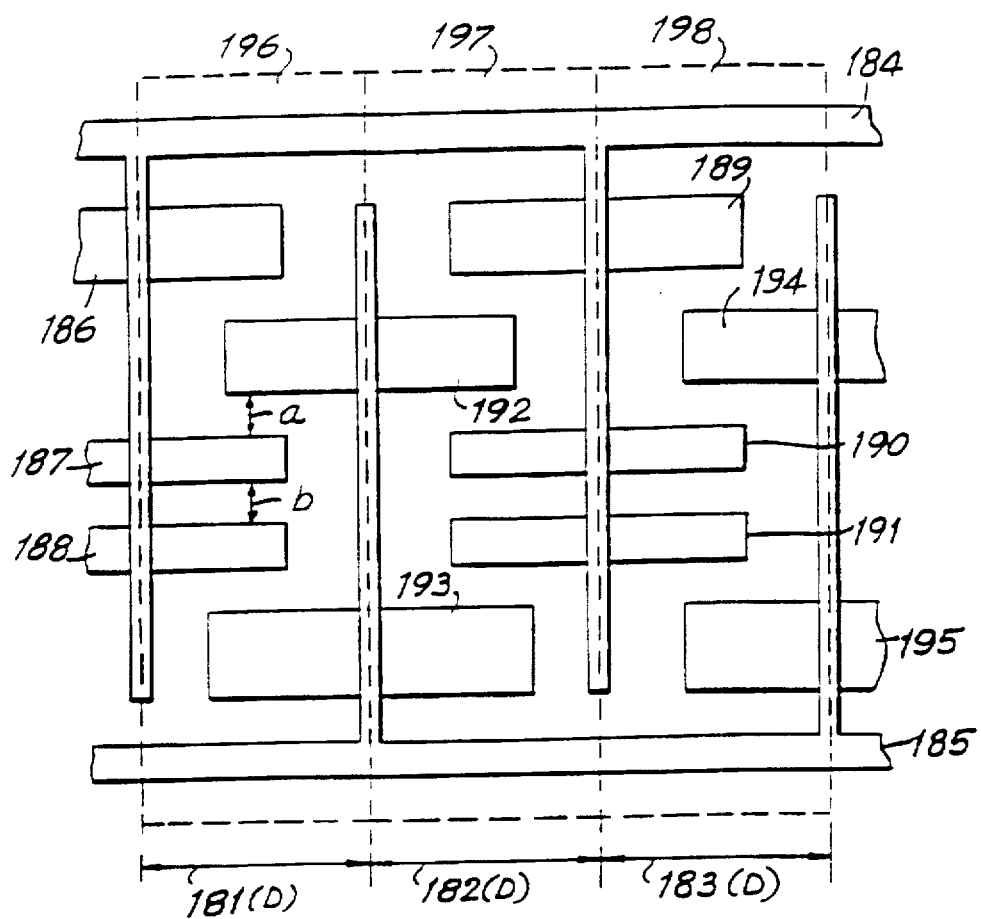
FIG. 9 is a top plan view of a unit cell of a driver circuit formed in accordance with the invention.

FIG. 9 is a preferred circuit pattern layout for a plurality of unit cells 196, 197 and 198 of a driver circuit having a small pitch, equivalent to a picture element pitch (or twice as large as a picture element pitch) to be provided in the source line driver circuit and/or the gate line driver circuit. Reference numerals 181, 182 and 183 correspond to either a single picture element pitch or a double picture element pitch in which D represents the length. Forming the driver circuit with cells in sequence, with D as a cycle, while utilizing the layout of FIG. 8 will provide effective use of space and enhance miniturization and picture element density.

The unit cells shown in FIG. 9 include a positive power source line 184 and a negative power source line 185; a plurality of silicon thin film regions 186-191 which form a plurality of P-type TFT source, drain and channel regions; and a plurality of silicon thin film region 192-195 which form a plurality of N-type TFT source, drain and channel regions. The elements of each TFT can be separated by etching silicon thin film to form islands regardless of their homopolarity and heteropolarity.

If the distance between N-type TFT silicon thin film island 192 and P-type TFT silicon thin film region 187 is denoted "a" and the distance between P-type TFT silicon thin film region 187 and 188 is denoted "b", distances a and b can be made approximately equal to each other. Accordingly, the integration in the direction in which a unit cell is repeated can be increased by arranging alternating islands of P-type TFT's and N-type TFT's to utilize these characteristics advantageously.

Figure 10A:
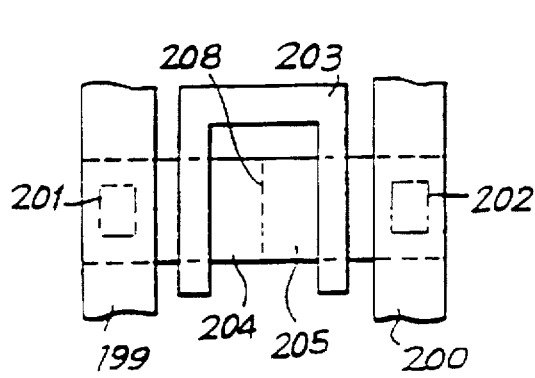
FIGS. 10A and 10B are top plan views of inverters of thin film transistors formed in accordance with the invention.
Figure 10B:
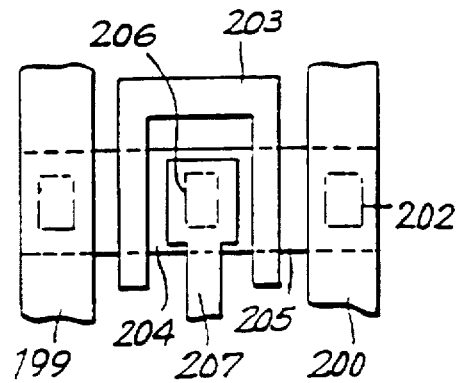

FIGS. 10A and 10B illustrate configurations to increase the integration of these elements. An inverter formed of complementary TFT's is formed between a positive power source line 199 and a negative power source line 200. A P-type region 204 and N-type region 205 with a boundary 208 therebetween are formed in a thin silicon film. A through hole 201 and a through hole 202 are provided for electrically coupling P-type region 204 with positive source line 109 and N-type region 205 with negative source line 200, respectively. A gate electrode 203 is provided over both portions 204 and 205. A through hole 206 is provided at the drain portion of regions 204 and 205 to electrically couple an output line 207 of the inverter. It is evident that the configuration shown in FIG. 10B is an effective utilization of space.

It is preferable to reduce the clock noise at source line driver circuit 12. As shown in FIG. 1, source line driver circuit 12 is provided with video signal buses 14, 15 and 16 and a line for transmitting at least a pair of dual clock signals CL and $\overline{CL}$ for driving shift register 13. If there is a difference between stray capacitance formed between video signal bus 36 and the CL line and the stray capacitance formed between video signal bus 36 and the $\overline{CL}$ line, noise in the form of spike synchronizing with the clock signal is unintentionally added to the video signal. This results in an uneven display and forms lines on the picture displayed by the active matrix panel.

Figure 11A:
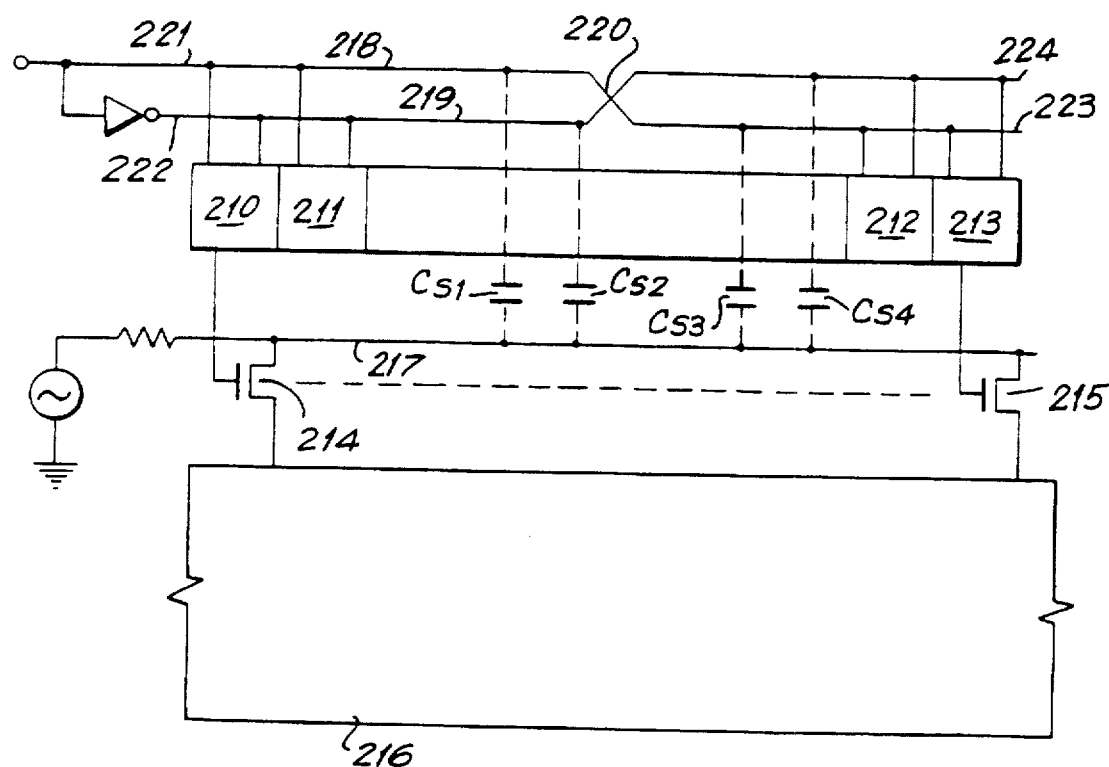
FIG. 11A is a circuit diagram of a source line driver for an active matrix panel formed in accordance with the invention.

FIG. 11A is a circuit diagram illustrating a clock line configuration for alleviating this problem. A source line driver circuit including a shift register having a plurality of unit cells 210, 211, 212 and 213 is provided. The unit cells are electrically coupled to a plurality of sample hold circuits 214 and 215 which are coupled with a picture element matrix 216 and a video signal bus 217. A CL line 218 and a $\overline{CL}$ 219 are twisted, crossing near their centers 220. Accordingly, the average distances between CL line 218 and the video signal bus and between $\overline{CL}$ line 219 and the video signal bus are about equal. As a result, the value of stray capacitance $(C_{S1}+C_{S3})$, which is formed between the CL line and the video signal bus is equal to the value of stray capacitance $(C_{S2}+C_{S4})$ formed between the $\overline{CL}$ line and the video signal bus.

Figure 11B:
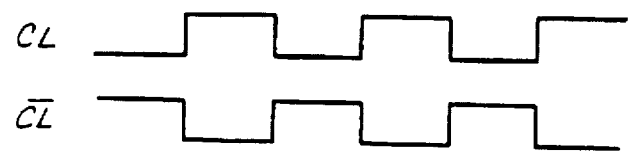
FIG. 11B is a timing diagram for the source line driver circuit shown in FIG. 11A.

FIG. 11B is a timing diagram for the circuit shown in FIG. 11A. The rising edge of CL corresponds to the trailing edge of $\overline{CL}$. The rising edge of $\overline{CL}$ corresponds to the trailing edge of CL. Consequently, clock noise added to the video signal is sharply reduced and picture quality is improved. Similar effects can be achieved by twisting the CL and the $\overline{CL}$ lines several times.

Figure 12:
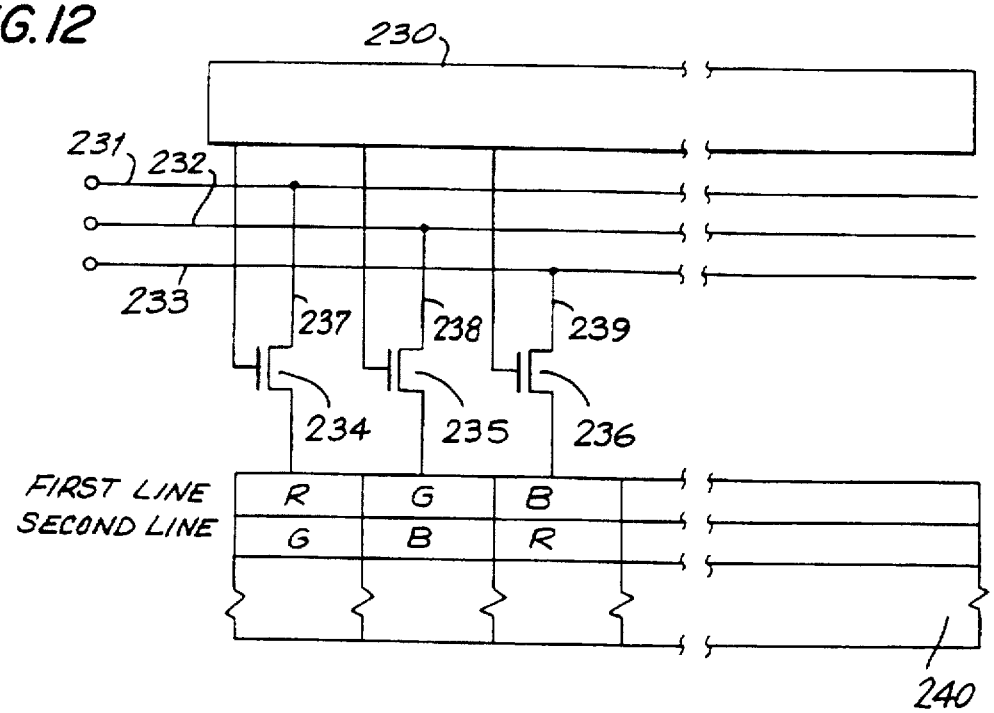
FIG. 12 is a circuit diagram of a shiftline register portion of an active matrix panel formed in accordance with the invention.

It is advantageous to provide sample hold circuit lines that have equal resistance. FIG. 12 shows a shift register 230 that is included in source line driver circuit 12 of FIG. 1. Shift register 230 is coupled to a plurality of sample hold circuits 234, 235 and 236 which are also coupled to a plurality of video signal buses 231, 232 and 233. Corresponding sample hold circuits 234, 235 and 236 are also coupled to a picture element matrix 240.

Picture element signals corresponding to the colors, red (R), green (G) and blue (B), for example, are transmitted to the three video signal buses 231, 232 and 233, respectively. The combination is then changed by a single horizontal scanning. Because the three signal buses require low resistance, it is common to form the signal buses from metals, such as aluminum. However, as has been discussed with reference to the complimentary TFT's in FIG. 3A and 3B, it is advantageous to form these three lines from the same material as the gate electrode, which can be formed of polycrystalline silicon. Because the heat resistance of polycrystalline silicon thin films is much higher than of metallic films, and because the lengths of lines 237, 238 and 239 will not be equal if they are connected in straight lines, the resistances of these lines will not be equal. Differences in line resistance result in uneven displays and the generation of lines. Accordingly, it is preferable to form lines 237, 238 and 239 so that the resistances will be equal. This can be accomplished by adjusting the widths and lengths of these lines.

It is advantageous to form an active matrix panel with a high speed driver circuit. However, as shown in FIG. 5, TFT's are generally slower than monocrystalline silicon MOSFETs. Accordingly, a conventional shift register made from TFT's will not be fast enough to drive an active matrix panel assembled in accordance with the invention. Accordingly, the shift line register circuit shown in FIG. 13A will compensate for the voltage current characteristics of the TFT's and make up for their slow speed.

Figure 13A:
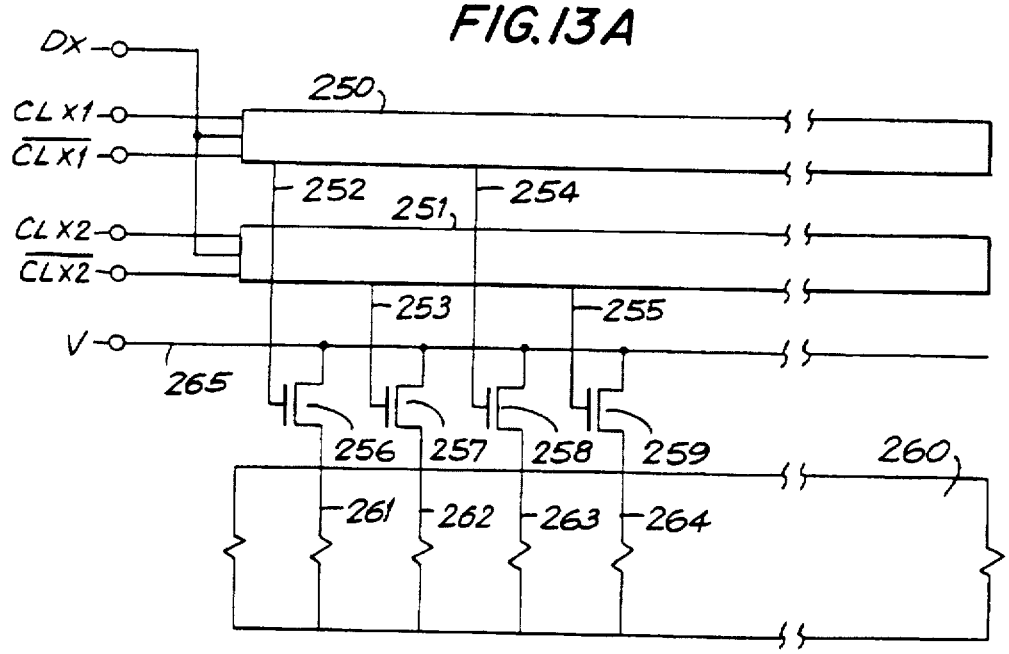
FIG. 13A is a circuit diagram of a shiftline register portion of an active matrix panel formed in accordance with the invention.

As Shown in FIG. 13A, start signal DX and clocks CLX1 and $\overline{CLX1}$ are applied to a first shift register 250 included in a source line driver circuit to output sampling pulses 252, 254, etc. Start signal DX and clocks CLX2 and $\overline{CLX2}$ are applied to a second shift register 251 included in the source line driver circuit to output sampling pulses 253, 255, etc. Lines 252-255 are each coupled to a sample hold circuit 256, 257, 258 and 259. A video signal bus 265, driven by a signal V, is also coupled to sample hold circuits 256-259 which are in turn coupled to a series of source lines 261, 262, 263 and 264.

Figure 13B:
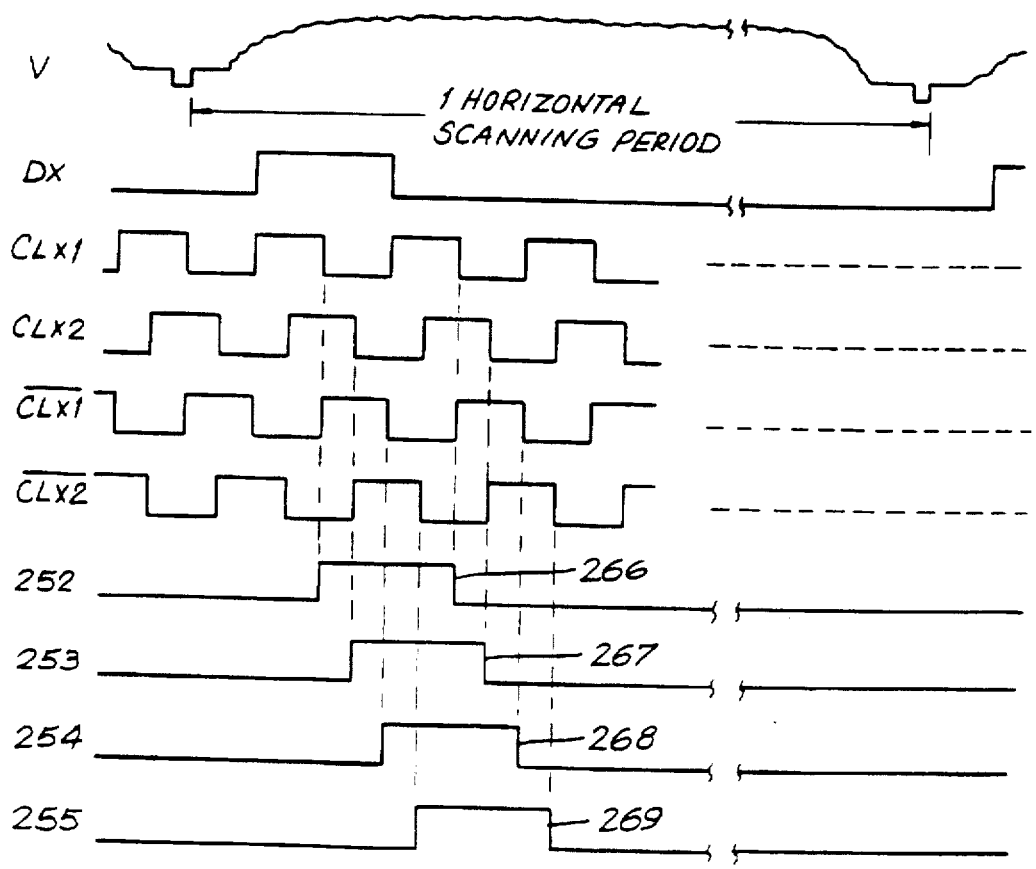
FIG. 13B is a timing diagram for the circuit of FIG. 13A.

The signals and pulses outputed from shift registers 250 and 251 are shown in FIG. 13B. The clocks which drive shift registers 250 and 251 have phases that are offset by approximately 90°. When the source line driver circuit is provided with N system shift resisters, each shift resister is driven by N system clocks and reverse clocks with phase off set by approximately 180°/N. If the frequency of CLX1 an CLX2 is denoted as f, sampling pulses 252 to 255 are outputed in order by intervals of ¼f hour. Video signal V is sampled at each edge 266, 267, 268 and 269 and is held at source line 261 and 264. This results in a sampling with a frequency of 4f. This allows a shift resister driven by a clock of frequency f which makes up for the inherent slow speed of TFT shift resisters.

When the above described source line driver circuit of FIG. 13A is provided with N system shift registers, a sampling frequency of 2Nf can be achieved with a shift register driven by a clock of frequency f. Accordingly, the active matrix panel can be adequately driven by a driver circuit formed of TFT's.

Figure 14:
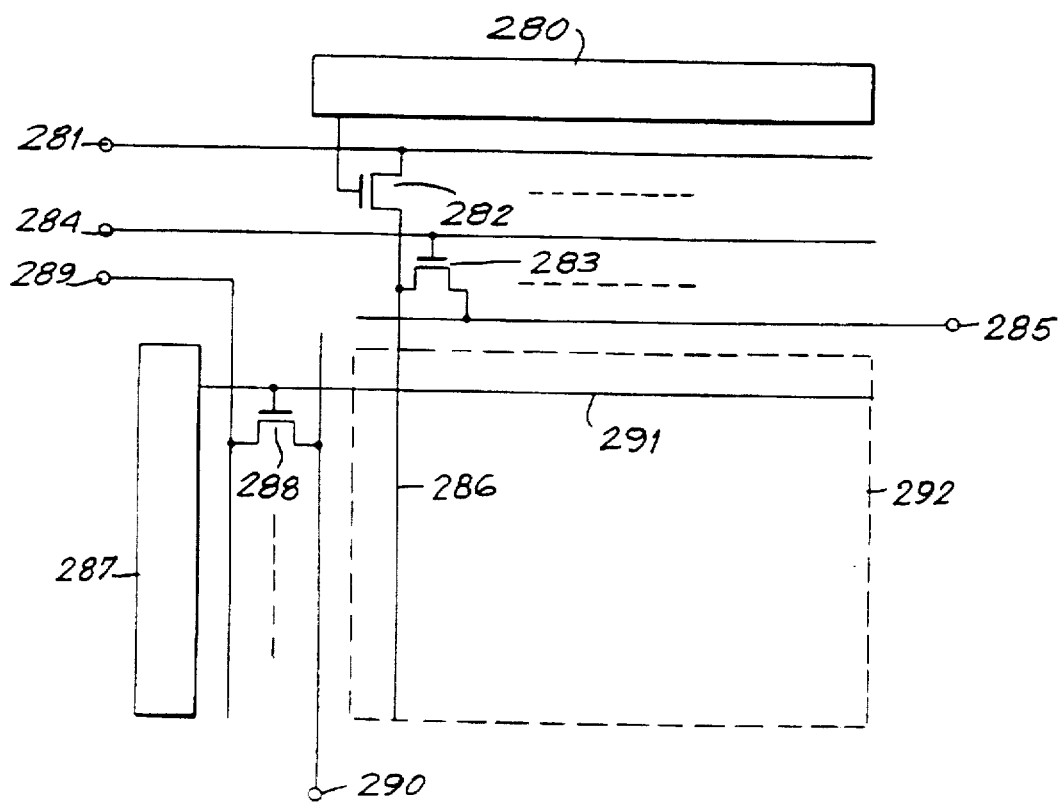
FIG. 14 is a circuit diagram of an active matrix panel including a shift register in a source line driver circuit formed in accordance with the invention.

FIG. 14 illustrates an embodiment of the invention in which a test mechanism is provided at each output from source line driver circuit 12 and gate line driver circuit 21. Source line driver circuit 12 includes a shift register 280 coupled to a sample hold circuit 282 which is coupled to a video signal bus terminal 281 by a video signal bus. Sample hold circuit 282 is coupled to a source line driver test circuit 283 which is coupled to a control terminal (first common terminal) 284, a test signal output terminal (second common terminal) 285 and a source line 286. A gate line driver circuit includes a shift register 287 coupled to a gate line driver test circuit 288 which is coupled to a test signal output terminal 290, a gate line 291 and a test signal input terminal 289. Gate line 291 and source line 286 are coupled to the picture element TFT in display matrix 292 and the test circuits are coupled to each source and gate line.

A predetermined test signal is input into video signal bus terminal 281 and shift register 280 is scanned. If the signal output serially at terminal 285 meets a predetermined standard, it is designated "good", and if not, it is designated "poor". A predetermined test signal is input and shift register 287 is scanned. If the signal output serially at terminal 290 meets a predetermined standard, the gate line driver circuit is designated "good", and if not, it is designated "poor". In this manner, the active matrix panel can be automatically and electrically tested. Such testing is superior to conventional visual observations.

Figure 15A:
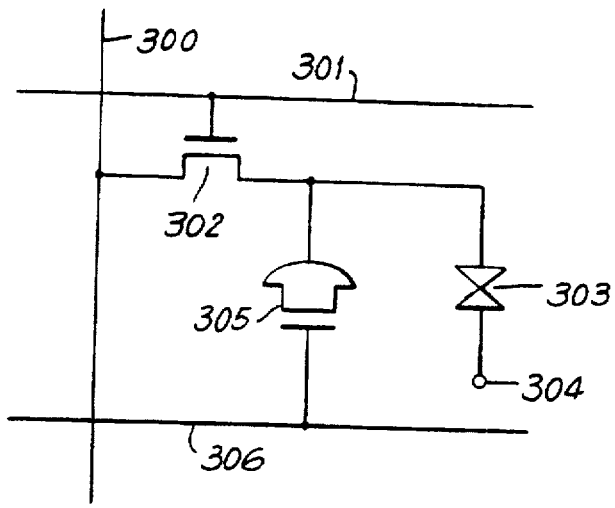
FIG. 15A is a schematic circuit diagram of a picture element of an active matrix panel constructed in accordance with the invention.

It is advantageous to form storage capacitors at each picture element without adding additional steps to the active matrix formation procedure. FIG. 15A illustrates the equivalent circuit of a picture element 327 shown in cross-sectional view in FIG. 15B. The circuit for each picture element includes a source line 300 and a gate line 301 coupled to a picture element TFT 302 which operates as a switch. TFT 302 is coupled to a metal oxide semiconductor (MOS) capacitor 305 and a liquid crystal cell 303 including a common electrode 304 and a gate electrode 306.

Figure 15B:
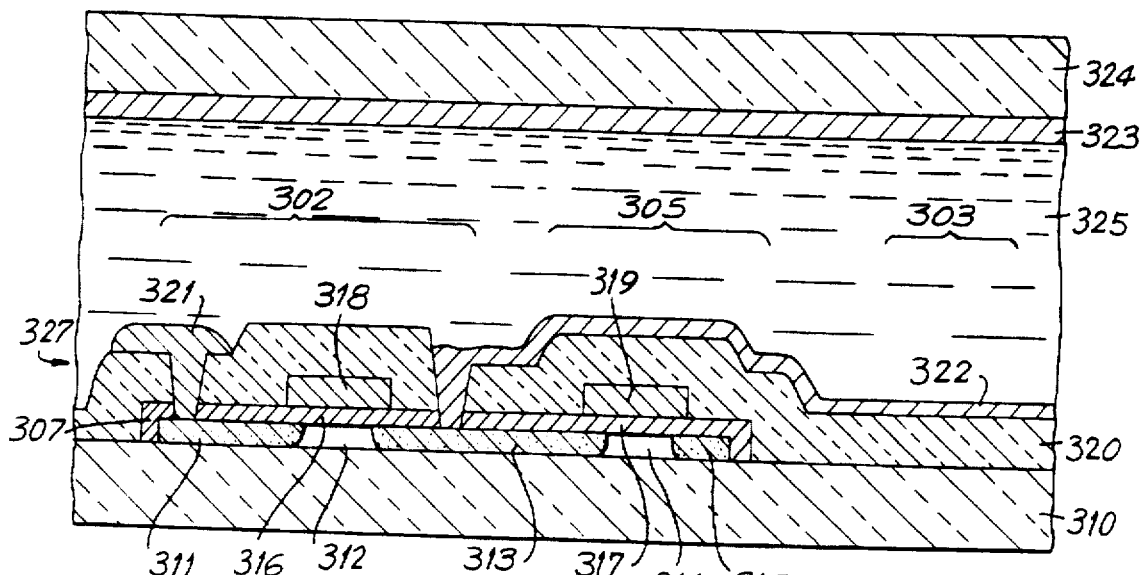
FIG. 15B is a cross-sectional view of the picture element illustrated in FIG. 15A.

Additional details of picture element 327 are shown in FIG. 15B. Picture element 327 includes transparent insulating substrates 310 and 324, silicon thin film layer 307 which includes channel regions 312 and 314 and doped regions 311, 313 and 315 forming channel and source and drain regions. Gate insulating films 316 and 317 are formed from silicon thin film 307 and gate electrodes 318 and 319 formed thereon. An insulating layer 320, is formed across the substrate and a source line 321, a transparent conductive film 322 which forms the picture element electrode is formed on insulating layer 320. A common electrode 323 formed of a transparent conductive film is formed on substrate 324 and liquid crystal material 325 is in the space between substrates 310 and 324.

As shown in FIG. 15B, MOS capacitor 305 has the same cross-sectional structure as picture element TFT 302. Accordingly, it is not necessary to add additional manufacturing steps to form MOS capacitor 305, which can be formed from the same layers of material as TFT 302 during the same patterning procedure.

If MOS capacitor 305 is used as a storage capacitor, it should maintain a channel (inversion) layer at region 314. A predetermined voltage is applied to gate electrode 306 of MOS capacitor 305 to turn capacitor 305 ON to maintain inversion layer 314. This can be accomplished with a positive power source for an N-type MOS capacitor or a negative power source for P-type MOS capacitor.

A gate insulating film is normally extremely thin. Therefore, it can form a storage capacitor that is from 5 to 10 times as large as a capacitor formed with a conventional insulating layer having the same surface area. Accordingly, the surface area of the capacitor can be reduced to increase the aperture ratio of the active matrix panel.

Figure 16A:
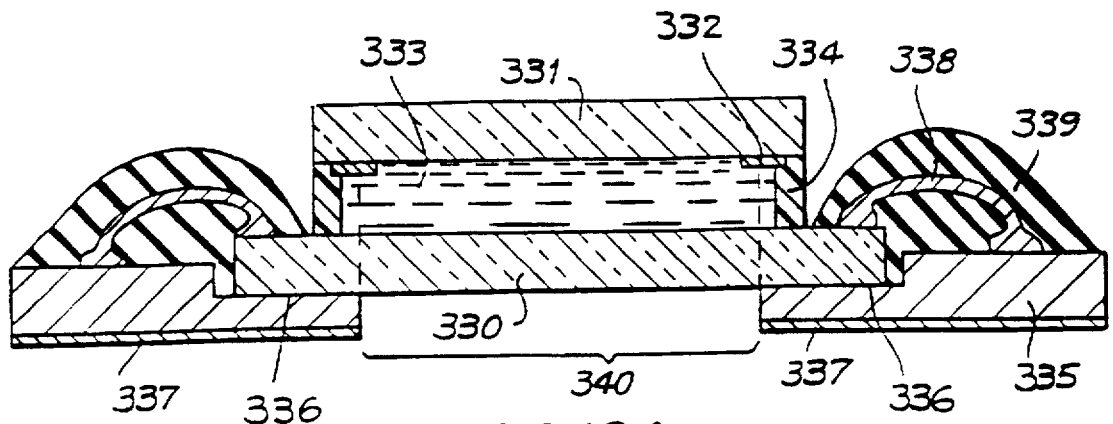
FIG. 16A is a cross-sectional view illustrating mounting of a liquid crystal display device constructed in accordance with the invention.
Figure 16B:
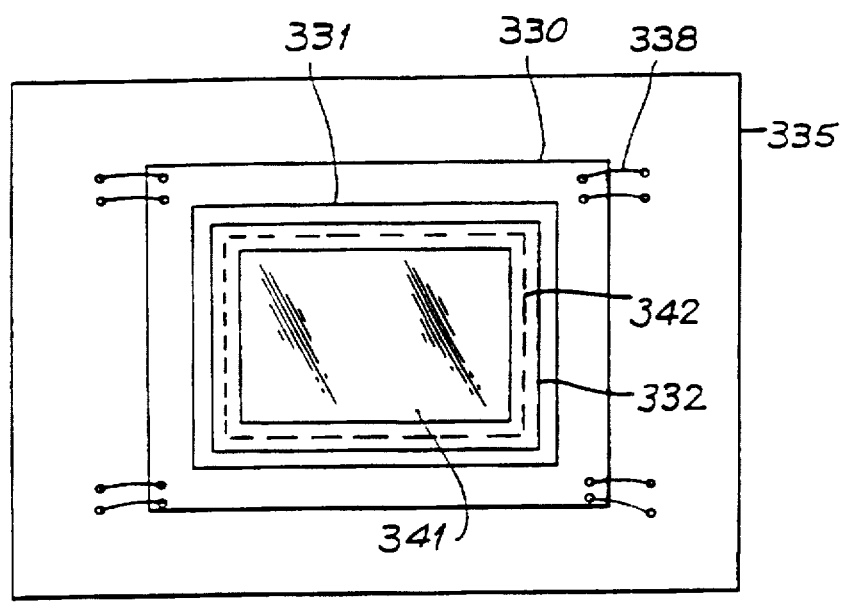
FIG. 16B is a top plan view of the display device of FIG. 16A.

FIGS. 16A and 16B show advantageous structures for mounting an active matrix panel having a built-in driver circuit in a device. A picture element matrix and driver circuit including TFT's having the same cross-sectional structure are formed on a transparent substrate 330. A common electrode is formed on an opposed transparent substrate 331 and a sealing member 334 fixes the substrates in cooperating relationship. The gap between the substrates is filled with a liquid crystal material 333. Substrate 330 is disposed in a concave portion 336 of a mounting substrate 335 having an aperture 340. A wire 338 formed of a metal such as gold or aluminum and a protecting member 339 secure substrate 330 in concave portion 336. Concave portion 336 improves the connecting strength of wire 338. It is advantageous to provide a shading member 337 over a portion of mounting substrate 335 and as a "belt" around the periphery of opposing substrate 331 to improve the external appearance of a display device formed of this active matrix panel.

FIG. 16B is a plan view of the mounted panel shown in FIG. 16A. FIG. 16B illustrates the positioning of a picture element matrix portion 341 and a dotted lined 342 illustrates the aperture portion of mounting substrate 335.

Figure 17:
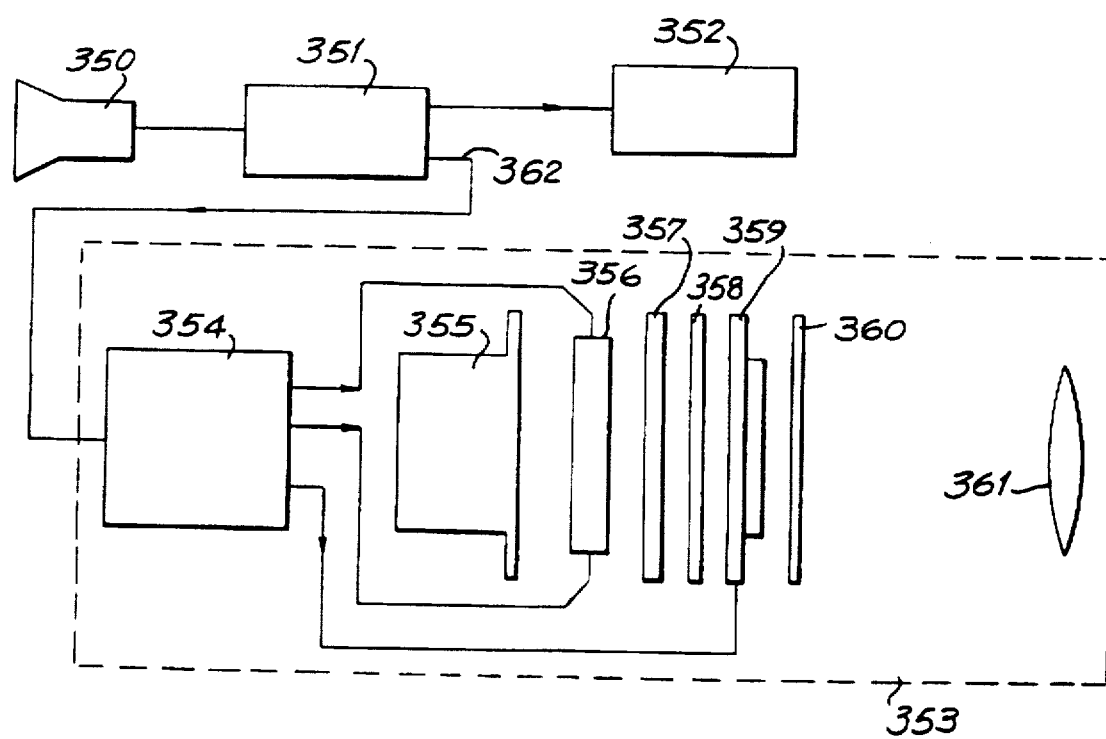
FIG. 17 is a block diagram of an electric view finder including an active matrix liquid crystal display panel formed in accordance with the invention.

An active matrix formed in this manner has the following advantages. Stress applied to metallic wires 338 is uniform which improves the connecting strength. When the active matrix panel is used as a backlit transmissive type display device, unintentional leakage of light around the periphery of the picture element is prevented. An active matrix formed in accordance with invention is also particularly well suited to be included in an electric view finder (EVF) of a video camera or the like. By integrating the driver circuit formed of complementary TFT's at the periphery of the picture element matrix, a small sized, inexpensive and reliable active matrix panel having low power consumption and high resolution is obtained. A block diagram of a device including an electric view finder 353 is showing in FIG. 17. A sensing device 350 transmits a signal to a video signal processing circuit 351. Circuit 351 transmits a signal to a recording apparatus 352 and a composite video signal to electric view finder 353.

Electric view finder 353 includes a driving circuit portion 354 that includes a chroma circuit, a synchronized timing signal formation circuit, a liquid crystal panel driving signal formation circuit, a power source circuit and a back light driving circuit. Electric view finder 353 further includes a luminous source 356 for providing back light, a reflector 355, a diffuser 357, a plurality of polarizers 358 and 360, an active matrix panel 359 and a lens 361. Electric view finder 353 has the following advantages over conventional cathode ray tube view finders.

1. A color electric view finder of extremely high resolution having a picture element pitch of 50 µm and less can be achieved by including an active matrix panel having a color filter.

2. Electric view finder 353 uses less power than a cathode ray tube view finder.

3. Electric view finder 353 can be smaller and thereby save space.

4. The shape and configuration of electric view finder 353 is more adaptable and flexible than a CRT view finder, permitting novel designs such as flat electric view finders.

An active matrix panel constructed in accordance with the invention is advantageously included in a color projection display device. FIG. 18 is a block diagram of a projection type color display device 390. Projector 390 includes a light source 370 such as a halogen lamp focused by a parabolic mirror 371 and an infrared filter 372 for shielding heat generated by light source 370 so that only visible rays exit filter 370 and enter the dichroic mirror system. A first dichroic mirror 373 reflects blue light having a wave length of about 500 nm. Remaining light is transmitted therethrough. The reflected blue light is reflected by a reflection mirror 374 and then enters blue light modulation liquid crystal light valve 378. Light transmitted through dichroic mirror 373 illuminates a green light reflecting dichroic mirror 375 and green light having a wave length of about 300 to 600 nm is reflected into a green light modulation liquid crystal light valve 379. The remaining light, having a wave length of about 600 nm or longer (red) is transmitted through a dichroic mirror 375 and is reflected by a pair of reflection mirrors 376 and 377 into a red light modulation light valve 380.

Blue, green and red light valves 378, 379 and 380 are active matrix panels driven by a primary color signal. The blue, green and red light is synthesized by a dichroic prism system 383. Prism system 383 is constructed so that the blue reflection surface 381 and a red reflection surface 382 cross at right angles. The synthesized color image is projected and magnified through a projection lens 384.

A projection device including an active matrix liquid crystal display panel constructed in accordance with the invention has the following advantages over conventional cathode ray tube video projection systems:

1. Projection lens 384 can have a small aperture because the light modulating panels can be small and of higher density than a CRT. This can lead to a small, light and inexpensive projection device.

2. Because the active matrix panel has a high aperture ratio, a bright projection beam can be generated even if the projection lens has a small aperture.

3. The registration of the red, blue and green colors is excellent because the optical axis of the three panels is conformed by the dichroic mirrors and prisms.

By integrating a gate line and a source line driver circuit formed of complementary TFT's on a transparent substrate of a picture element matrix, the following advantages can be obtained.

1. Although the degree of resolution in prior art panels is limited by a mounting pitch of the driver integrated circuit, by employing the built in driver integrated circuit in accordance with the invention, a liquid crystal panel having a picture element pitch of 50 µm and less can be achieved.

2. Because the external dimensions of the mounting substrate can be reduced, the display and the device including the display can be smaller, thinner and lighter.

3. Because it is unnecessary to attach the driver integrated circuit to an external portion, fewer connections are required which lowers the cost of a display device including the liquid crystal panel.

4. Because an external connection for the driver integrated circuit is not required, the reliability of the display device is improved.

5. By forming the driver circuit with complementary TFT's, the power requirements of the device are reduced.

An active matrix panel having these advantages is particularly well suited for inclusion in an electric view finder for a video camera, a portable image monitor and a small video projection system.

The active matrix panel will also operate over an extended voltage and operating frequency range by using complementary TFT's and a circuit structure with a static shift register. A TFT has a high OFF current and the temperature dependency of OFF current is also large. However, these characteristics are controlled and compensated for by including a static shift register which expands the voltage and frequency range.

Because the active matrix can be formed in which first doping impurities are included in the TFT source and drain regions and then second doping impurities are included having opposite polarity and a higher concentration than the first impurities, an inexpensive complementary TFT integrated circuit can be obtained with only one additional photo process and P type and N type TFT's having well balanced performance can be conveniently obtained.

The length of the gate of the TFT's which form the driver circuit is shorter than the gate of the TFT's which form the picture elements. This allows the actuating speed of the driver circuit to be increased and the writing and holding of electric charge of each picture element can be optimized.

The following features can be included in an active matrix formed in accordance with the invention. The integration of the driver circuit portion is increased by the pattern layout of functional blocks shown in FIGS. 8, 9, 10a and 10b, so that the unit cells can be formed within a small pitch such as the picture element pitch. The clock noise which can unintentionally mingle with video signals can be removed to improve the display image. The resistance of the connection lines to the sample hold circuits are made uniform so that the writing level of the display signal to all of the source lines is made uniform which improves display characteristics.

Further advantages are achieved when a source line driver circuit is formed as shown in FIG. 13A and is driven by the method shown in FIG. 13B which includes N series shift registers driven by a clock of frequency f so that the video signal can be sampled with a frequency of 2Nf. This allows use of a built in driver circuit including TFT's whose ON current is not necessarily large enough.

Including a test circuit in each output of the driver circuit allows checking of an active matrix panel. Previously this is carried out by visual examination of a conventional test pattern. Now this can be carried out electrically and automatically. Provision of a storage capacitor in each picture element as shown in FIGS. 15A and 15B permit the electric charge in each element to be held more steadily. This is done at no increase in cost of production or decrease in aperture ratio.

The mounting structure of FIGS. 16A and 16B also prevents unintentional leakage of light around the periphery of the picture element portions of the matrix. This improves performance of back lit devices as well as transparent display devices. The advantages of an active matrix panel formed in accordance with the invention permits the construction of electric view finders that are superior to conventional cathode ray tube (CRT) view finders. By employing active matrix panel with a picture element pitch of 50 μm or less and a color filter, extremely high resolution color electric view finders can be formed. These view finders will have low power consumption, small size and light weight. They can be included in novel designs such as flat electric view finders.

Projection type color display devices including active matrix panels constructed in accordance with the invention have advantages not found in conventional CRT projection devices. The image can be formed on a panel that is smaller and has higher resolution than a CRT, a smaller aperture projection lens can be used and a smaller, lighter and less expensive projection device can be provided. Because of the high aperture ratio of the active matrix panel, a bright display can be obtained with a small aperture projection lens. The optical axis of the red, green and blue light valves will completely coincide due to the effects of the dichroic mirrors and dichroic prisms so that registration of the three colors can be performed satisfactorily.

It will thus be seen that the objects set forth above, among those made apparent from the preceding description, are efficiently attained and, since certain changes may be made in carrying out the above method and in the article set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A liquid crystal device comprising:

a pair of opposed and spaced apart substrates;

a plurality of gate lines and a plurality of source lines disposed on one of the substrates, the plurality of source lines crossing the plurality of gate lines;

a plurality of picture elements arranged on one of the substrates and connected to said source lines and said gate lines;

a gate line driver circuit connected to said gate lines; and a gate line driver test circuit comprising transistors, said transistors being coupled to a test signal input terminal, test signal output terminal and said gate lines, wherein test check signals are output to said test signal output terminal through said transistors in accordance with application of test signals to the test signal input terminal and operation of the gate line driver circuit.

2. The liquid crystal device of claim 1, wherein said transistors comprises thin film transistors.

3. A liquid crystal device comprising:

a pair of opposed and spaced apart substrates;

a plurality of gate lines and a plurality of source lines disposed on one of the substrates, the plurality of source lines crossing the plurality of gate lines;

a plurality of picture elements arranged on one of the substrates and connected to said source lines and said gate lines;

a source line driver circuit connected to said source lines; and a source line driver test circuit comprising transistors, said transistors being coupled to a test signal input terminal, a test signal output terminal and said source lines, wherein test check signals are output to said test signal output terminal through said transistors in accordance with application of test signals to the test signal input terminal and the operation of the source line driver circuit.

4. The liquid crystal device of claim 3, wherein said transistors comprise thin film transistors.

5. A liquid crystal device comprising:

a pair of opposed and spaced apart insulating substrates;

a plurality of gate lines and a plurality of source lines disposed on one of the substrates, the plurality of source lines crossing the plurality of gate lines;

a plurality of picture elements arranged on the one of the substrates and connected to said source lines and said gate lines;

a source line driver circuit connected to said source lines;

a gate line driver circuit connected to said gate lines;

a source line driver test circuit comprising first transistors, said first transistors being coupled to a first test signal output terminal, a first test signal input terminal and said source lines; and a gate line driver test circuit comprising second transistors, said second transistors being coupled to a second test signal input terminal, a second test signal output terminal and said gate lines, wherein first test signals applied to the first test signal input terminal are output to said first test signal output terminal through said first transistors in accordance with the operation of the source line driver circuit, and second test signals applied to the second test signal input terminals are output to said second test signal output terminal through said second transistors in accordance with the operation of the gate line driver circuit.

6. The liquid crystal device of claim 5, wherein said first transistors and said second transistors comprise thin film transistors.

7. A liquid crystal device comprising:

a plurality of first lines and a plurality of second lines arranged in a matrix;

output terminals of driver circuits connected to said plurality of first lines and said plurality of second lines; and at least one driver test circuit comprising transistors, said transistors of said at least one driver test circuit being coupled to a test signal input terminal, a test signal output terminal andone of said first and second lines, wherein test check signals are output to said test signal output terminal through said transistors in accordance with application of test signals to the test signal input terminal and the operation of said driver circuit.

8. A method for driving a gate line driver test circuit of a liquid crystal device, the liquid crystal device including a plurality of gate lines and a plurality of source lines disposed on one of a pair of substrates, a plurality of picture elements connected to the plurality of gate lines and the plurality of source lines, a gate line driver circuit connected to the gate lines, and a gate line driver test circuit comprising transistors, the transistors being connected to the gate lines, a test signal input terminal and a test signal output terminal, the method comprising:

applying test signals to the test signal input terminal when the gate line driver circuit is operated; and testing whether predetermined signals are applied to the test signal output terminal.

9. A method for driving a source line driver test circuit of a liquid crystal device, the liquid crystal device including a plurality of gate lines and a plurality of source lines disposed on one of a pair of substrates, a plurality of picture elements connected to the plurality of gate lines and the plurality of source lines, a source line driver circuit connected to the source lines, and a source line driver test circuit comprising transistors, the transistors being connected to the source lines, a test signal input terminal and a test signal output terminal, the method comprising:

applying test signals to the test signal input terminal when the source line driver circuit is operated; and testing whether the test signals are supplied to the test signal output terminal.

10. A method for driving at least one driver test circuit of a liquid crystal device, the liquid crystal device including a plurality of first lines and a plurality of second lines arranged in a matrix, output terminals of driver circuits connected to the first and second lines, and at least one driver test circuit comprising transistors, the transistors of the at least one driver test circuit being connected to one of the first and second lines, a test signal input terminal and a test signal output terminal, the method comprising:

applying test signals to the test signal input terminal when at least one of the driver circuits is operated; and testing whether the test signals are applied to the test signal output terminal.

11. A method for driving a gate line driver test circuit and a source line driver test circuit of a liquid crystal device, the liquid crystal device including a plurality of gate lines and a plurality of source lines disposed on one of a pair of substrates, a plurality of picture elements connected to the plurality of gate lines and the plurality of source lines, a source line driver circuit connected to the source lines, a gate line driver circuit connected to the gate lines, a source line driver test circuit comprising first transistors, the first transistors being connected to the source lines, a first test signal input terminal and a first test signal output terminal, and a gate line driver test circuit comprising second transistors, the second transistors being connected to the gate lines, a second test signal input terminal and a second test signal output terminal, the method comprising:

applying first test signals to the first test signal input terminal and applying second test signals to the second test signal input terminal when the source line driver circuit and the gate line driver circuit are operated; and testing whether the first signals are applied to the first test signal output terminal and whether the second test signals are applied to the second test signal output terminal.

12. A method of forming a liquid crystal device comprising:

forming a pair of opposed and spaced apart substrates;

forming a plurality of gate lines and a plurality of source lines disposed on one of the substrates, the plurality of source lines crossing the plurality of gate lines;

forming a plurality of picutre elements arranged on one of the substrates and connected to said source lines and said gate lines;

forming a gate line driver circuit connected to said gate lines; and forming a gate line driver test circuit comprising transistors, said transistors being coupled to a test signal input terminal, test signal output terminal and said gate lines, wherein test check signals are output to said test signal output terminal through said transistors in accordance with application of test signals to the test signal input terminal and operation of the gate line driver circuit.

13. The method of forming a liquid crystal device of claim 12, wherein said transistors comprise thin film transistors.

14. A method of forming a liquid crystal device comprising:

forming a pair of opposed and spaced apart substrates;

forming a plurality of gate lines and a plurality of source lines disposed on one of the substrates, the plurality of source lines crossing the plurality of gate lines;

forming a plurality of picture elements arranged on the one of the substrates and connected to said source lines and said gate lines;

forming a source line driver circuit connected to said source lines; and forming a source line driver test circuit comprising transistors, said transistors being coupled to a test signal input terminal, a test signal output terminal and said source lines, wherein test check signals are output to said test signal output terminal through said transistors in accordance with application of test signals to the test signal input terminal and the operation of the source line driver circuit.

15. The method of forming a liquid crystal device of claim 14, wherein said transistors comprise thin film transistors.

16. A method of forming a liquid crystal device comprising:

forming a pair of opposed and spaced apart insulating substrates;

forming a plurality of gate lines and a plurality of source lines disposed on one of the substrates, the plurality of source lines crossing the plurality of gate lines;

forming a plurality of picture elements arranged on the one of the substrates and connected to said source lines and said gate lines;

forming a source line driver circuit connected to said source lines;

forming a gate line driver circuit connected to said gate lines;

forming a source line driver test circuit comprising first transistors, said first transistors being coupled to a first test signal output terminal, a first test signal input terminal and said source lines; and forming a gate line driver test circuit comprising second transistors, said second transistors being coupled to a second test signal input terminal, a second test signal output terminal and said gate lines, wherein first test check signals are output to said first test signal output terminal through said first transistors in accordance with application of first test signals to the first test signal input terminal and the operation of the source line driver circuit, and second test check signals are output to said second test signal output terminal through said second transistors in accordance with application of second test signals to the second test signal input terminal and the operation of the gate line driver circuit.

17. The method of forming a liquid crystal device of claim 16, wherein said first transistors and said second transistors comprise thin film transistors.

18. A method of forming a liquid crystal device comprising:

forming a plurality of first lines and a plurality of second lines arranged in a matrix;

forming output terminals of driver circuits connected to said plurality of first lines and said plurality of second lines; and forming at least one driver test circuit comprising transistors, said transistors of said at least one driver test circuit being coupled to a test signal input terminal, a test signal output terminal and one of said first and second lines, wherein check test signals are output to said test signal output terminal through said transistors in accordance with application of test signals to the test signal input terminal and the operation of said driver circuit.

19. A projection type display device including a light source, at least one light valve, and at least one projecting optical system for projecting a color image, the at least one light valve including a plurality of liquid crystal cells, wherein data signals are supplied to the plurality of liquid crystal cells through a plurality of field effect transistors arranged in a plurality of picture elements, the light valve comprising:

a pair of opposed and spaced apart substrates;

a plurality of gate lines and a plurality of source lines disposed on one of the substrates, the plurality of source lines crossing the plurality of gate lines;

a plurality of picture elements arranged on one of the substrates and connected to said source lines and said gate lines;

a gate line driver circuit connected to said gate lines; and a gate line driver test circuit comprising transistors, said transistors being coupled to a test signal input terminal, test signal output terminal and said gate lines, wherein test check signals are output to said test signal output terminal through said transistors in accordance with application of test signals to the test signal input terminal and operation of the gate line driver circuit.

20. The projection type display device of claim 19, wherein said transistors comprises thin film transistors.

21. A projection type display device including a light source, at least one light valve, and at least one projecting optical system for projecting a color image, the at least one light valve including a plurality of liquid crystal cells, wherein data signals are supplied to the plurality of liquid crystal cells through a plurality of field effect transistors arranged in a plurality of picture elements, the light valve comprising:

a pair of opposed and spaced apart substrates;

a plurality of gate lines and a plurality of source lines disposed on one of the substrates, the plurality of source lines crossing the plurality of gate lines;

a plurality of picture elements arranged on the one of the substrates and connected to said source lines and said gate lines;

a source line driver circuit connected to said source lines; and a source line driver test circuit comprising transistors, said transistors being coupled to a test signal input terminal, a test signal output terminal and said source lines, wherein test check signals are output to said test signal output terminal through said transistors in accordance with application of test signals to the test signal input terminal and the operation of the source line driver circuit.

22. The projection type display device of claim 21, wherein said transistors comprise thin film transistors.

23. A projection type display device including a light source, at least one light valve, and at least one projecting optical system for projecting a color image, the at least one light valve including a plurality of liquid crystal cells, wherein data signals are supplied to the plurality of liquid crystal cells through a plurality of field effect transistors arranged in a plurality of picture elements, the light valve comprising:

a pair of opposed and spaced apart insulating substrates;

a plurality of gate lines and a plurality of source lines disposed on one of the substrates, the plurality of source lines crossing the plurality of gate lines;

a plurality of picture elements arranged on the one of the substrates and connected to said source lines and said gate lines;

a source line driver circuit connected to said source lines;

a gate line driver circuit connected to said gate lines;

a source line driver test circuit comprising first transistors, said first transistors being coupled to a first test signal output terminal, a first test signal input terminal and said source lines; and a gate line driver test circuit comprising second transistors, said second transistors being coupled to a second test signal input terminal, a second test signal output terminal and said gate lines, wherein first test check signals are output to said first test signal output terminal through said first transistors in accordance with application of first test signals to the first test signal input terminal and the operation of the source line driver circuit, and second test check signals are output to said second test signal output terminal through said second transistors in accordance with application of second test signals to the second test signal input terminal and the operation of the gate line driver circuit.

24. The projection type display device of claim 23, wherein said first transistors and said second transistors comprise thin film transistors.

25. A projection type display device including a light source, at least one light valve, and at least one projecting optical system for projecting a color image, the at least one light valve including a plurality of liquid crystal cells, wherein data signals are supplied to the plurality of liquid crystal cells through a plurality of field effect transistors arranged in a plurality of picture elements, the light valve comprising:

a plurality of first lines and a plurality of second lines arranged in a matrix;

output terminals of driver circuits connected to said plurality of first lines and said plurality of second lines; and at least one driver test circuit comprising transistors, said transistors of said at least one driver test circuit being coupled to a test signal input terminal, a test signal output terminal and one of said first and second lines, wherein test signals applied to the test signal input terminal are output to said test signal output terminal through said transistors in accordance with the operation of said driver circuit.

26. An electric view finder device including a liquid crystal device and a light source for illuminating the liquid crystal device, the liquid crystal device including a plurality of liquid crystal cells, wherein data signals are supplied to the liquid crystal cells through a plurality of transistors arranged in a plurality of picture elements, the liquid crystal device comprising:

a pair of opposed and spaced apart substrates;

a plurality of gate lines and a plurality of source lines disposed on one of the substrates, the plurality of source lines crossing the plurality of gate lines;

the plurality of picture elements arranged on one of the substrates and connected to said source lines and said gate lines;

a gate line driver circuit connected to said gate lines; and a gate line driver test circuit comprising transistors, said transistors being coupled to a test signal input terminal, test signal output terminal and said gate lines, wherein test signals applied to the test signal input terminal are output to said test signal output terminal through said transistors in accordance with operation of the gate line driver circuit.

27. The electric view finder device of claim 26, wherein said transistors comprises thin film transistors.

28. An electric view finder device including a liquid crystal device and a light source for illuminating the liquid crystal device, the liquid crystal device including a plurality of liquid crystal cells, wherein data signals are supplied to the liquid crystal cells through a plurality of transistors arranged in a plurality of picture elements, the liquid crystal device comprising:

a pair of opposed and spaced apart substrates;

a plurality of gate lines and a plurality of source lines disposed on one of the substrates, the plurality of source lines crossing the plurality of gate lines;

the plurality of picture elements arranged on the one of the substrates and connected to said source lines and said gate lines;

a source line driver circuit connected to said source lines; and a source line driver test circuit comprising transistors, said transistors being coupled to a test signal input terminal, a test signal output terminal and said source lines, wherein test signals applied to the test signal input terminal are output to said test signal output terminal through said transistors in accordance with the operation of the source line driver circuit.

29. The electric view finder device of claim 28, wherein said transistors comprise thin film transistors.

30. An electric view finder device including a liquid crystal device and a light source for illuminating the liquid crystal device, the liquid crystal device including a plurality of liquid crystal cells, wherein data signals are supplied to the liquid crystal cells through a plurality of transistors arranged in a plurality of picture elements, the liquid crystal device comprising:

a pair of opposed and spaced apart insulating substrates;

a plurality of gate lines and a plurality of source lines disposed on one of the substrates, the plurality of source lines crossing the plurality of gate lines;

the plurality of picture elements arranged on the one of the substrates and connected to said source lines and said gate lines;

a source line driver circuit connected to said source lines;

a gate line driver circuit connected to said gate lines;

a source line driver test circuit comprising first transistors, said first transistors being coupled to a first test signal output terminal, a first test signal input terminal and said source lines; and a gate line driver test circuit comprising second transistors, said second transistors being coupled to a second test signal input terminal, a second test signal output terminal and said gate lines, wherein first test signals applied to the first test signal input terminal are output to said first test signal output terminal through said first transistors in accordance with the operation of the source line driver circuit, and second test signals applied to the second test signal input terminals are output to said second test signal output terminal through said second transistors in accordance with the operation of the gate line driver circuit.

31. The electric view finder device of claim 30, wherein said first transistors and said second transistors comprise thin film transistors.

32. An electric view finder device including a liquid crystal device and a light source for illuminating the liquid crystal device, the liquid crystal device including a plurality of liquid crystal cells, wherein data signals are supplied to the liquid crystal cells through a plurality of transistors arranged in a plurality of picture elements, the liquid crystal device comprising:

a plurality of first lines and a plurality of second lines arranged in a matrix;

output terminals of driver circuits connected to said plurality of first lines and said plurality of second lines; and at least one driver test circuit comprising transistors, said transistors of said at least one driver test circuit being coupled to a test signal input terminal, a test signal output terminal and one of said first and second lines, wherein test signals applied to the test signal input terminal are output to said test signal output terminal through said transistors in accordance with the operation of said driver circuit.

33. An active matrix panel in which a plurality of gate lines, a plurality of source lines, and a source line driver circuit for providing signals to the source lines are provided on a substrate, the source line driver circuit comprising:

a shift register, sample hold circuits which are controlled by output from the shift register and which sample data signals provided to a signal line and supplies the sampled data signals to said source lines, a plurality of switching elements electrically connected to the source lines, and a first common terminal electrically connected to the plurality of switching elements, wherein each of the signals supplied to the source lines through the sample hold circuits is supplied to a second common terminal through each of the switching elements, in response to the control signal from the first common terminal.

34. A method of testing an active matrix panel in which a plurality of gate lines, a plurality of source lines, and a source line driver circuit for providing signals to the source lines are provided on a substrate, the source line driver circuit comprising:

a shift register, sample hold circuits which are controlled by output from the shift register and which sample data signals provided to a signal bus terminal and supply the sampled data signals to said source lines, a plurality of switching elements electrically connected to the source lines, and a first common terminal electrically connected to the plurality of switching elements, the method comprising the steps of:

inputting a predetermined test signal into a signal bus terminal to supply it to the sample hold circuits, and scanning the shift register for supplying the control signal to the sample hold circuits; and supplying each of the signals supplied to the source lines through the sample hold circuits to a second common terminal through each of the switching elements, in response to the control signal from the first common terminals.

35. A driving circuit of an active matrix panel in which a plurality of gate lines, a plurality of source lines, and a source line driver circuit for providing signals to the source lines are provided on a substrate, the source line driver circuit comprising:

a shift register, sample hold circuits which are controlled by output from the shift register and which sample data signals provided to a signal line and supplies the sampled data signals to said source lines, a plurality of switching elements electrically connected to the source lines, and a first common terminal electrically connected to the plurality of switching elements, wherein each of the signals supplied to the source lines through the sample hold circuits is supplied to a second common terminal through each of the switching elements, in response to the control signal from the first common terminal.

36. A method of testing a driving circuit for an active matrix panel in which a plurality of gate lines, a plurality of source lines, and a source line driver circuit for providing signals to the source lines are provided on a substrate, the source line driver circuit comprising:

a shift register, sample hold circuits which are controlled by output from the shift register and which sample data signals provided to a signal bus terminal and supply the sampled data signals to said source lines, a plurality of switching elements electrically connected to the source lines, and a first common terminal electrically connected to the plurality of switching elements, the method comprising the steps of:

inputting a predetermined test signal into a signal bus terminal to supply it to the sample hold circuit, and scanning the shift register for supplying the control signal to the sample hold circuits; and supplying each of the signals supplied to the source lines through the sample hold circuits to a second common terminal through each of the switching elements, in response to the control signal from the first common terminals.

* * * * *